US011862273B2

(12) United States Patent
Park et al.

(10) Patent No.: US 11,862,273 B2
(45) Date of Patent: Jan. 2, 2024

(54) STORAGE DEVICES AND METHODS OF OPERATING STORAGE DEVICES

(71) Applicant: SAMSUNG ELECTRONICS CO., LTD., Suwon-si (KR)

(72) Inventors: Sehwan Park, Yongin-si (KR); Jinyoung Kim, Seoul (KR); Youngdeok Seo, Seoul (KR); Dongmin Shin, Seoul (KR); Joonsuc Jang, Hwaseong-si (KR); Sungmin Joe, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/068,337

(22) Filed: Dec. 19, 2022

(65) Prior Publication Data
US 2023/0124303 A1 Apr. 20, 2023

Related U.S. Application Data

(63) Continuation of application No. 17/469,422, filed on Sep. 8, 2021, now Pat. No. 11,562,804.

(30) Foreign Application Priority Data

Feb. 8, 2021 (KR) .......................... 10-2021-0017619

(51) Int. Cl.
*G11C 29/42* (2006.01)
*G11C 29/44* (2006.01)
(Continued)

(52) U.S. Cl.
CPC ............ *G11C 29/42* (2013.01); *G11C 16/102* (2013.01); *G11C 16/26* (2013.01);
(Continued)

(58) Field of Classification Search
CPC ....... G11C 29/42; G11C 16/102; G11C 16/26; G11C 29/12015; G11C 29/18;
(Continued)

(56) References Cited

U.S. PATENT DOCUMENTS 7,697,347 B2 4/2010 Byeon
8,930,779 B2 1/2015 Ware et al.
(Continued)

FOREIGN PATENT DOCUMENTS

KR 10-0866961 11/2008
KR 10-1912372 10/2018

OTHER PUBLICATIONS

Notice of Allowance dated Sep. 28, 2022 in corresponding U.S. Appl. No. 17/469,422.

*Primary Examiner* — Han Yang
(74) *Attorney, Agent, or Firm* — F. Chau & Associates, LLC

(57) ABSTRACT

A storage device includes a nonvolatile memory device and a memory controller to control the nonvolatile memory device. The nonvolatile memory device includes a memory cell array. The memory cell array includes a normal cell region, a parity cell region and a redundancy cell region. First bit-lines are connected to the normal cell region and the parity cell region and second bit-lines are connected to the redundancy cell region. The memory controller includes an error correction code (ECC) engine to generate parity data. The memory controller stores user data in the normal cell region, controls the nonvolatile memory device to perform a column repair on first defective bit-lines among the first bit-lines, assigns additional column addresses to the first defective bit-lines and the second bit-lines and stores at least a portion of the parity data in a region corresponding to the additionally assigned column addresses.

20 Claims, 20 Drawing Sheets

(51) Int. Cl.
*G11C 29/18* (2006.01)
*G11C 16/10* (2006.01)
*G11C 29/12* (2006.01)
*G11C 16/26* (2006.01)

(52) U.S. Cl.
CPC ........ *G11C 29/12015* (2013.01); *G11C 29/18* (2013.01); *G11C 29/4401* (2013.01); *G11C 2029/1202* (2013.01); *G11C 2029/1204* (2013.01); *G11C 2029/1802* (2013.01)

(58) Field of Classification Search
CPC ........ G11C 29/4401; G11C 2029/1202; G11C 2029/1204
See application file for complete search history.

(56) References Cited

U.S. PATENT DOCUMENTS

| | | |
|---|---|---|
| 8,996,956 B2 | 3/2015 | Yang et al. |
| 9,715,424 B1 | 7/2017 | Ware et al. |
| 10,235,258 B2 | 3/2019 | Son et al. |
| 2002/0196683 A1 | 12/2002 | Ohtani et al. |
| 2013/0208548 A1 | 8/2013 | Hung |
| 2014/0169092 A1* | 6/2014 | Miyamoto .......... G06F 11/1048 365/185.05 |
| 2022/0254433 A1 | 8/2022 | Park et al. |

* cited by examiner

STORAGE DEVICES AND METHODS OF OPERATING STORAGE DEVICES

CROSS-REFERENCE TO RELATED APPLICATION

This U.S. patent application is a continuation application of U.S. patent application Ser. No. 17/469,422 filed Sep. 8, 2021, which claims priority under 35 USC § 119 to Korean Patent Application No. 10-2021-0017619, filed on Feb. 8, 2021, in the Korean Intellectual Property Office (KIPO), the disclosures of which are incorporated by reference in their entirety herein.

1. Technical Field

Example embodiments generally relate to memory devices, and more particularly to storage devices and methods of operating storage devices.

2. Discussion of Related Art

Semiconductor memory devices are classified into a volatile memory and a nonvolatile memory. Data stored in the volatile memory may be lost after power-off. Data stored in the nonvolatile memory are retained even after power-off. A flash memory device is an example of a nonvolatile memory device. A flash memory device has a mass storage capability, relatively high noise immunity, and a low power operation. Therefore, flash memory devices are employed in various fields. For example, a mobile system such as a smart-phone, or a tablet personal computer (PC) may employ flash memory as a storage medium.

Memory capacity of semiconductor memory devices is increasing according to developments in manufacturing processes. As integration degree of semiconductor memory devices increases, the number of defective memory cells increases and yield of semiconductor memory devices decreases. Redundant memory cells may be used or an error correction code (ECC) operation may be performed to repair defective memory cells. Yield and performance of semiconductor memory devices may depend on efficiency of such a repairing scheme.

SUMMARY

At least one exemplary embodiment provides a storage device capable of increasing usability of a redundancy cell region and increasing efficiency of error correction by an error correction code (ECC) engine.

At least one exemplary embodiment provide a method of operating a storage device capable of increasing usability of a redundancy cell region and increasing efficiency of error correction by an ECC engine.

According to an example embodiment, a storage device includes a nonvolatile memory device and a memory controller to control the at least one nonvolatile memory device. The nonvolatile memory device includes a memory cell array, a page buffer circuit and an address decoder. The memory cell array includes a normal cell region, a parity cell region and a redundancy cell region associated with repairing defective columns of the normal cell region and the parity cell region. The memory cell array includes a plurality of nonvolatile memory cells coupled to first bit-lines and second bit-lines. The first bit-lines are connected to the normal cell region and the parity cell region. The second bit-lines are connected to the redundancy cell region. The page buffer circuit is connected to the memory cell array through the first bit-lines and the second bit-lines. The address decoder is connected to the memory cell array through a plurality of word-lines. The memory controller includes an error correction code (ECC) engine to generate parity data by performing an ECC encoding on user data to be stored in the normal cell region. The memory controller stores the user data in the normal cell region, controls the nonvolatile memory device to perform a column repair on first defective bit-lines among the first bit-lines, assigns additional column addresses to the first defective bit-lines and the second bit-lines and stores at least a portion of the parity data in a region corresponding to the additionally assigned column addresses.

According to an example embodiment, there is provided a method of operating a storage device including a nonvolatile memory device and a memory controller to control the nonvolatile memory device. According to the method, parity data is generated by an error correction code (ECC) engine in the memory controller by performing an ECC encoding on user data to be stored in a normal cell region of a memory cell array of the nonvolatile memory device including the normal cell region, a parity cell region and a redundancy cell region associated with repairing defective columns of the normal cell region and the parity cell region. A column repair is performed on first defective bit-lines among first bit-lines connected to the normal cell region and the parity cell region. Additional column addresses are assigned by the memory controller to the first defective bit-lines and second bit-lines connected to the redundancy cell region. At least a portion of the parity data is stored in a region corresponding to the additionally assigned column addresses by the nonvolatile memory device.

According to an example embodiment, a storage device includes a nonvolatile memory device and a memory controller to control the nonvolatile memory device. The nonvolatile memory device includes a memory cell array, a page buffer circuit and an address decoder. The memory cell array includes a normal cell region, a parity cell region and a redundancy cell region associated with repairing defective columns of the normal cell region and the parity cell region. The memory cell array includes a plurality of nonvolatile memory cells coupled to first bit-lines and second bit-lines. The first bit-lines are connected to the normal cell region and the parity cell region. The second bit-lines are connected to the redundancy cell region. The page buffer circuit is connected to the memory cell array through the first bit-lines and the second bit-lines. The address decoder is connected to the memory cell array through a plurality of word-lines. The memory controller includes an error correction code (ECC) engine to generate parity data by performing an ECC encoding on user data to be stored in the normal cell region. The memory controller stores the user data in the normal cell region, controls the nonvolatile memory device to perform a column repair on first defective bit-lines among the first bit-lines, assigns additional column addresses to the first defective bit-lines and the second bit-lines and stores at least a portion of the parity data in a region corresponding to the additionally assigned column addresses. The nonvolatile memory device further includes a control circuit. The control circuit controls the page buffer circuit to perform the column repair on the first defective bit-lines among defective bit-lines associated with a given one of the defective columns. The control circuit skips the column repair on at least a portion of second defective bit-lines among defective bit-lines, stores defective column address information of the portion of second defective bit-lines in an information block, and provides the defective column address information to the memory controller in response to a request from the memory controller. The ECC engine selectively uses the defective column address information and performs an ECC decoding on the user data read from the at least one nonvolatile memory device based on the parity data from the nonvolatile memory device.

Accordingly, the nonvolatile memory device stores column addresses of defective bit-lines in the normal cell region, which are not repaired, in the information block, as defective column address information. The memory controller assigns additional column addresses to repaired bit-lines and second bit-lines coupled to the redundancy cell region associated with repairing the defective bit-lines in the normal cell region. The nonvolatile memory device stores a portion of the parity data in a region corresponding to the additionally assigned column addresses. The ECC engine in the memory controller performs ECC decoding on the user data based on the defective column address information and the parity data having increased bits. Therefore, the storage device may enhance error correction efficiency and may increase usability of the redundancy cell region.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

The inventive concept will be described more fully hereinafter with reference to the accompanying drawings, in which some example embodiments are shown.

Figure 1:
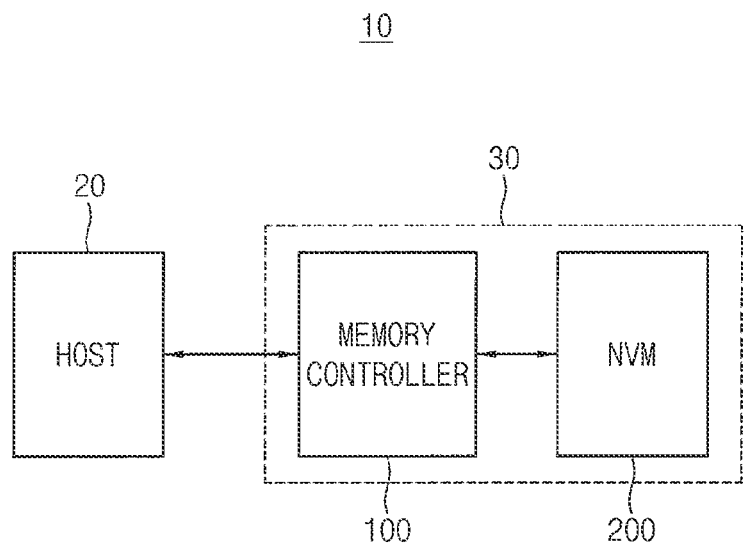
FIG. 1 is a block diagram illustrating an electronic device according to an example embodiment.

FIG. 1 is a block diagram illustrating an electronic device according to an example embodiment.

Referring to FIG. 1, an electronic device 10 includes a host 20 (e.g., a host device) and a storage device (or, a memory system) 30. The storage device 30 may include a memory controller (or, a storage controller) 100 and at least one nonvolatile memory device 200. The host 20 may control overall operations of the storage device 30.

The nonvolatile memory device 200 may be implemented with a NAND flash memory.

The memory controller 100 may exchange signals such as a command, an address, and data with the host 20. The memory controller 100 may write data to the nonvolatile memory device 200 and may read data from the nonvolatile memory device 200 according to a command from the host 20.

Figure 2:
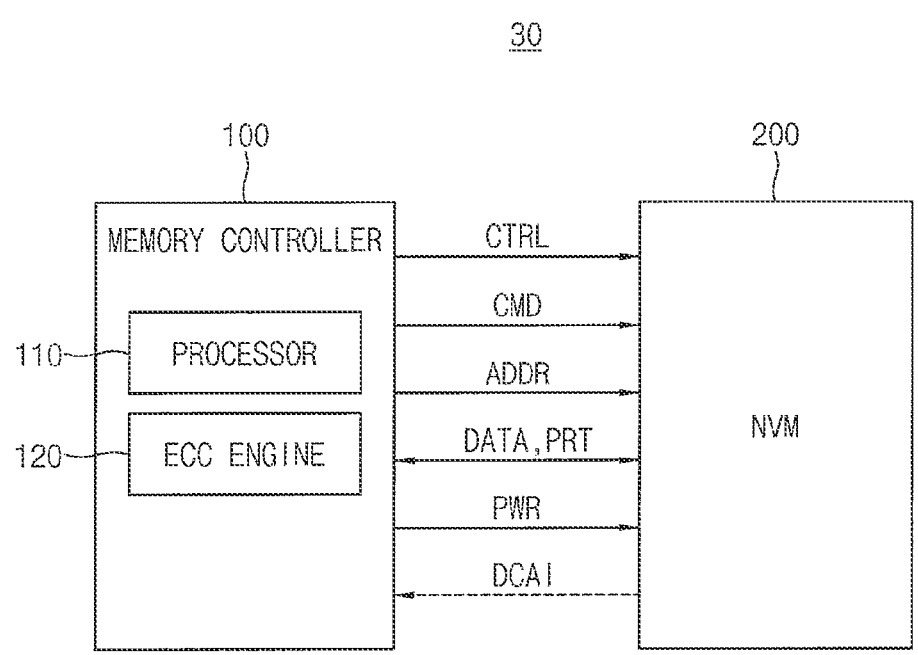
FIG. 2 is a block diagram illustrating the storage device in FIG. 1 according to an example embodiment.

FIG. 2 is a block diagram illustrating the storage device in FIG. 1 according to an example embodiment.

Referring to FIG. 2, the storage device 30 includes the memory controller 100 and the at least one nonvolatile memory device 200.

In an example embodiment, each of the memory controller 100 and the at least one nonvolatile memory device 200 may be provided with the form of a chip, a package, or a module. Alternatively, the memory controller 100 and the at least one nonvolatile memory device 200 may be packaged one of Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP) and etc.

The nonvolatile memory device 200 may perform an erase operation, a program operation or a write operation under control of the memory controller 100. The nonvolatile memory device 200 receives a command CMD, an address ADDR and user data DATA and parity data PRT through input/output lines from the memory controller 100 for performing such operations. In addition, the nonvolatile memory device 200 receives a control signal CTRL through a control line from the memory controller 100. In addition, the nonvolatile memory device 200 receives power PWR through a power line from the memory controller 100.

The nonvolatile memory device 200 may store column addresses of columns in which errors occur repeatedly in an information block as defective column addresses. The nonvolatile memory device 200 may provide the memory controller 100 with a defective column address DCAI associated with a given one the defective columns.

Memory cells of the nonvolatile memory device 200 may have a physical characteristic that a threshold voltage distribution varies due to causes, such as a program elapsed time, a temperature, a program disturbance, or a read disturbance. For example, data stored in the nonvolatile memory device 200 may become erroneous due to the above causes. The memory controller 100 utilizes a variety of error correction techniques to correct such errors. For example, the memory controller 100 includes an error correction code (ECC) engine 120 and a processor 110 to control the ECC engine 120.

During a read operation, the memory controller 100 may read data stored in a first page of the nonvolatile memory device 200, using a default read voltage set. The default read voltage set may include predetermined read voltages. The ECC engine 120 may detect and correct errors included in data read from the nonvolatile memory device 200. In an example embodiment, the ECC engine 120 is implemented in the form of hardware.

Data read in a read operation may include error bits more than the ECC engine 120 may correct. In this case, the ECC engine 200 fails to correct the errors of the data, which may be referred to as an 'uncorrectable error correction code (UECC) error'. Data having the UECC error may be referred to as 'UECC data'.

For example, when data read by means of the default read voltage set includes the UECC error, the processor 110 may adjust a read voltage set of the nonvolatile memory device 200. The memory controller 100 sends an address ADDR, a command CMD, and a control signal CTRL such that the nonvolatile memory device 200 performs a read operation by means of the adjusted read voltage set.

The adjusted read voltage set may be included in the control signal CTRL or the command CMD. The ECC engine 120 may detect and correct an error of data that is read using the adjusted read voltage set. For example, information indicating values of the set of voltages included in the adjusted read voltage set may be included in the control signal CTRL or the command CMD.

In an example embodiment, the processor 110 adjusts a read voltage set a predetermined number of times, and the ECC engine 120 detects and corrects an error of data that is read using the adjusted read voltage set. For example, the memory controller 100 may repeat execution of a set of operations for adjusting a read voltage set the predetermined number of times, read data using the adjusted read voltage set and correct an error of the read data.

When an error of read data is corrected during an iteration of the set of operations, the memory controller 100 may output corrected data to the host 20. For example, when a read operation is iterated under a control of the processor 110, read data or particular page data of the read data is stored in a buffer 130 in FIG. 3. The buffer 130 may be a static random access memory (SRAM).

When an error of read data is not corrected after an iteration of the set of operations (i.e., when the UECC error occurs), the memory controller 100 may determine a starting voltage set for performing a valley search operation based on the data stored in the buffer 130.

In an example embodiment, iteration of adjusting a read voltage set and reading data using the adjusted read voltage set is omitted.

When an error of read data is not corrected after the read operation based on the default read voltage set or after iteration of the set of operations, the processor 110 may select a program state which includes a highest error bit ratio, among the data stored in the buffer 130 and may determine a read voltage corresponding to the selected program state as the starting voltage set. The processor 110 may perform a valley search operation based on the determined starting voltage set to determine an optimal read level voltage and may perform a recovery read operation on the read data based on the optimal read level voltage.

For determining the optimal read level voltage, the processor 110 may set a search region defined by a starting read voltage and an ending read voltage, may determine whether the search region belongs to a reference region, may change the search region if the search region does not belong to the reference region, and may find a new read voltage to determine the optimal read level voltage if the search region belongs to the reference region.

The processor 110 may control the ECC engine 120 to perform a hard decision decoding or a soft decision decoding on the read data. The processor 110 may control the ECC engine 120 to perform the hard decision decoding on the read data based on the default read voltage set. In addition, the ECC engine 120 to perform the soft decision decoding on the read data based on soft decision read voltages having offsets with a hard decision read voltage used in the hard decision decoding.

The ECC engine 120 may generate parity data PRT including a first parity data and a second parity data by performing an ECC encoding on a user data to be stored in a memory cell array of the nonvolatile memory device 200. The memory controller 100 may store at least a portion of the parity data PRT in a region corresponding to a repaired column and a redundancy cell region of the memory cell array.

The ECC engine 120 may perform the hard decision decoding by using the first parity data, and may perform the soft decision decoding by using the defective column address information DCAI, the first parity data and the second parity data.

Figure 3:
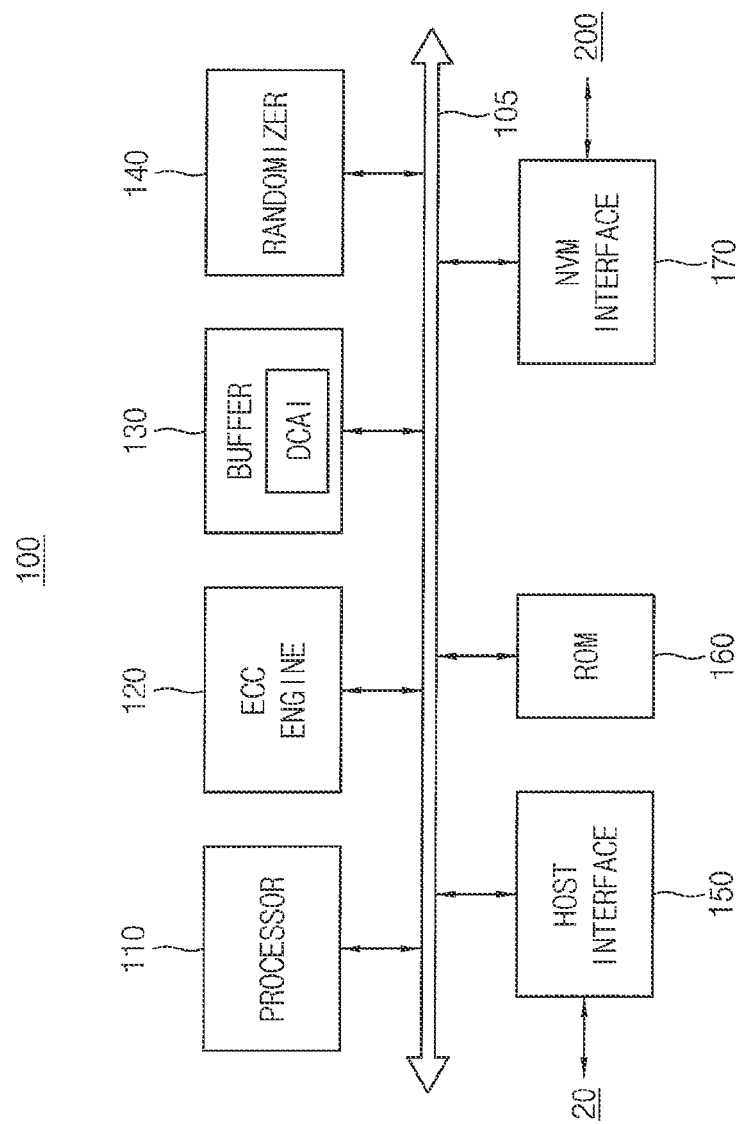
FIG. 3 is a block diagram illustrating the memory controller in the storage device of FIG. 2 according to an example embodiment.

FIG. 3 is a block diagram illustrating the memory controller in the storage device of FIG. 2 according to an example embodiment.

Referring to FIGS. 2 and 3, the memory controller 100 includes a processor 110, the ECC engine 120, the buffer 130, a randomizer 140, a host interface 150, a read only memory (ROM) 160 and a nonvolatile memory interface 170 which are connected via a bus 105.

The processor 110 may control an overall operation of the memory controller 100. The buffer 130 may store the defective column address information DCAI provided from the nonvolatile memory device 200 and may provide the defective column address information DCAI to the ECC engine 120. The ROM 160 may store a variety of information used by the memory controller 100 to operate, in firmware.

The ECC engine 120 may generate the parity data PRT, may perform the hard decision decoding by using first parity data of the parity data PRT, and may perform the soft decision decoding by using the defective column address information DCAI, the first parity data and second parity data of the parity data PRT.

The randomizer 140 may randomize data to be stored in the nonvolatile memory device 200. For example, the randomizer 140 may randomize data to be stored in the nonvolatile memory device 200 by a word-line.

The randomizer 140 may process data such that program states of memory cells connected to a word-line have the same ratio. For example, if memory cells connected to one word-line are quad-level cells (QLC) each storing 4-bit data, each of the memory cells may have one of an erase state and first through fifteenth program states. In this case, the randomizer 140 may randomize data such that in memory cells connected to one word-line, the number of memory cells having the erase state, and each of the number of memory cells having the first through fifteenth program states may be substantially the same as one another. For example, memory cells in which randomized data is stored have program states of which the number is equal to one another. The randomizer 140 may de-randomize data read from the nonvolatile memory device 200.

The randomizer 140 may randomize page data. For ease of understanding, an ideal operation of the randomizer 140 is described. However, the present disclosure is not limited thereto. For example, the randomizer 140 may randomize data such that in memory cells connected to one word-line, the number of memory cells having the erase state and each of the number of memory cells having the first through fifteenth program states are approximated to the same value. For example, memory cells in which randomized data is stored have program states of which the number may be similar to one another.

The memory controller 100 may communicate with the host 20 through the host interface 150. For example, the host interface 150 may support communication protocols such as Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), or Universal Flash Storage (UFS). The memory controller 100 may communicate with the nonvolatile memory device 200 through the nonvolatile memory interface 170.

Figure 4:
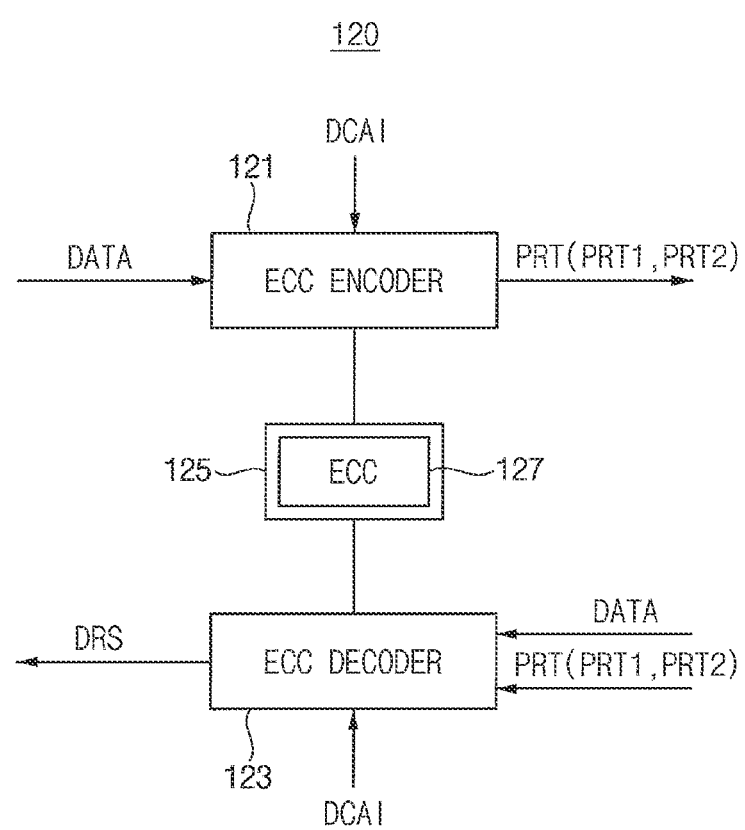
FIG. 4 is a block diagram illustrating an example of the ECC engine in the memory controller of FIG. 3 according to an example embodiment.

FIG. 4 is a block diagram illustrating an example of the ECC engine in the memory controller of FIG. 3 according to an example embodiment.

Referring to FIG. 4, the ECC engine 120 includes an ECC encoder 121 (e.g., an encoder circuit), an ECC decoder 123 (e.g., an ECC decoder circuit) and a memory 125 and the memory 125 may store an ECC 127.

The ECC encoder 121 may generate the parity data PRT including a first parity data PRT1 and a second parity data PRT2 by performing an ECC encoding on the user data based on the ECC 127. The first parity data PRT1 may be used for correcting errors in data read after the nonvolatile memory device 200 performs the column repair on the data and the second parity data PRT2 may be used with the first parity data PRT1 for correcting errors in the data on which the nonvolatile memory device 200 skips the column repair or the data on which the soft decision decoding is performed.

In addition, the ECC encoder 121 may adjust a number of bits of the second parity data PRT2 generated in the ECC encoding based on the defective column address information DCAI. For example, the ECC encoder 121 may increase or decrease the number of bits of the second parity data PRT2 based on a number of defective bit-lines designated by the defective column address information DCAI. The ECC encoder 121 may increase or decrease the number of bits of the second parity data PRT2 by using a portion or all of the ECC 127 when the ECC encoder 121 performs the ECC encoding.

In a read operation, the ECC decoder 123 may receive the user data DATA and the parity data PRT including the first parity data PRT1 and the second parity data PRT2 from the nonvolatile memory device 200, may receive the defective column address information DCAI from the buffer 130, may perform the hard decision decoding on the user data DATA by using the first parity data PRT1, may perform the soft decision decoding on the user data DATA by using the defective column address information DCAI, the first parity data PRT1 and the second parity data PRT2 and may provide the processor 110 with a decoding result signal DRS indicating a result of the decoding.

Figure 5:
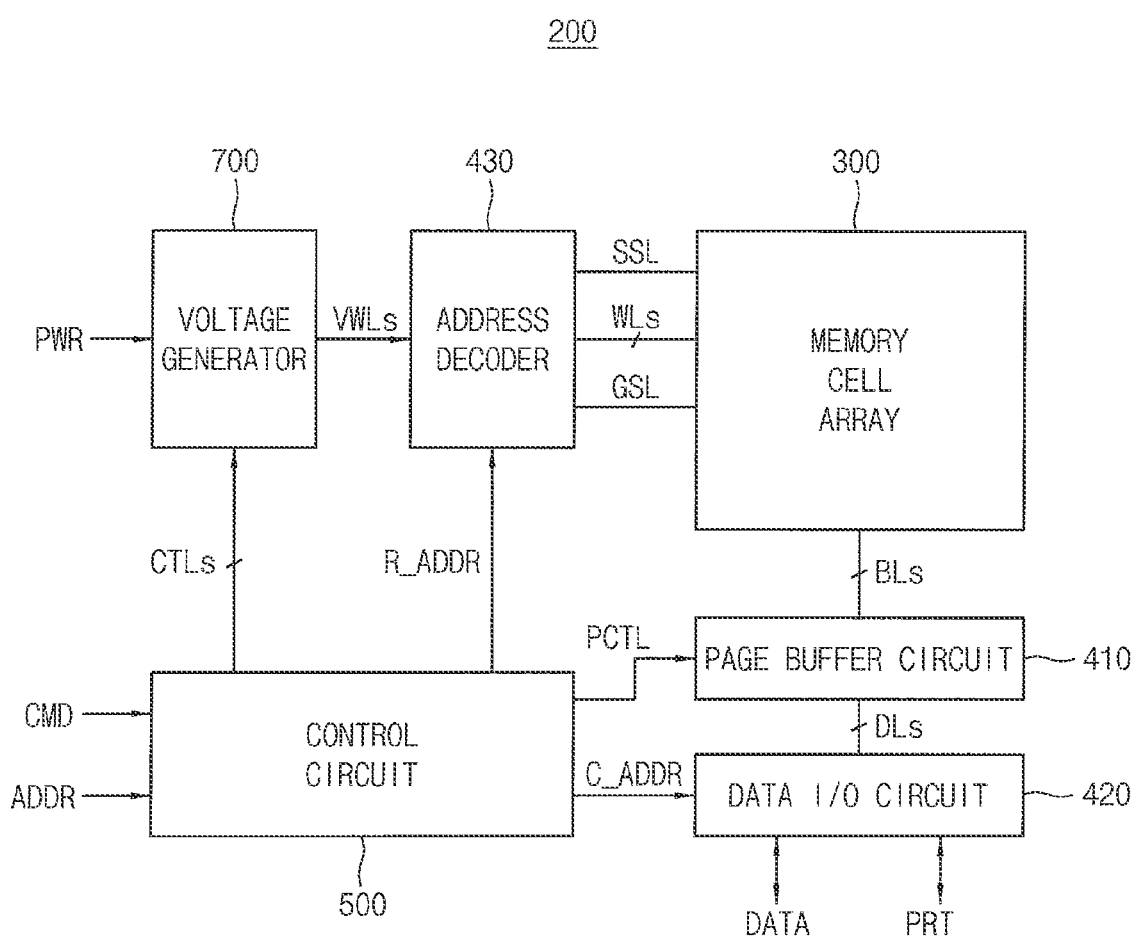
FIG. 5 is a block diagram illustrating the nonvolatile memory device in the storage device of FIG. 2 according to an example embodiment.

FIG. 5 is a block diagram illustrating the nonvolatile memory device in the storage device of FIG. 2 according to an example embodiment.

Referring to FIG. 5, the nonvolatile memory device 200 includes a memory cell array 300, an address decoder 430, a page buffer circuit 410, a data input/output circuit 420, a control circuit 500 and a voltage generator 700.

The memory cell array 300 may be coupled to the address decoder 430 through a string selection line SSL, a plurality of word-lines WLs, and a ground selection line GSL. In addition, the memory cell array 300 may be coupled to the page buffer circuit 410 through a plurality of bit-lines BLs.

The memory cell array 300 may include a plurality of memory cells coupled to the plurality of word-lines WLs and the plurality of bit-lines BLs.

In an example embodiment, the memory cell array 300 may be a three-dimensional memory cell array, which is formed on a substrate in a three-dimensional structure (or a vertical structure). In this case, the memory cell array 300 may include vertical cell strings that are vertically oriented such that at least one memory cell is located over another memory cell.

Figure 6:
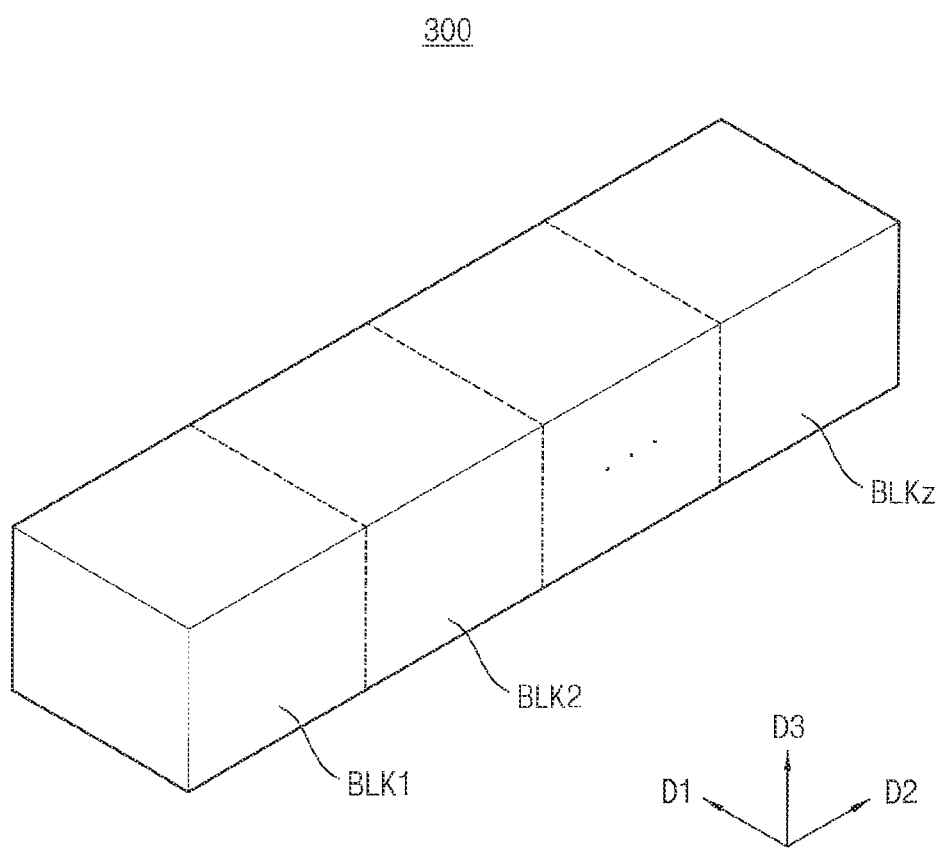
FIG. 6 is a block diagram illustrating the memory cell array in FIG. 5.

FIG. 6 is a block diagram illustrating the memory cell array in FIG. 5.

Referring to FIG. 6, the memory cell array 300 may include a plurality of memory blocks BLK1 to BLKz (z is an integer greater than two) that extends along first through third directions D1, D2 and D3. In an embodiment, the memory blocks BLK1 to BLKz are selected by the address decoder 430 in FIG. 4. For example, the address decoder 430 may select a memory block BLK corresponding to a block address among the memory blocks BLK1 to BLKz.

Figure 7:
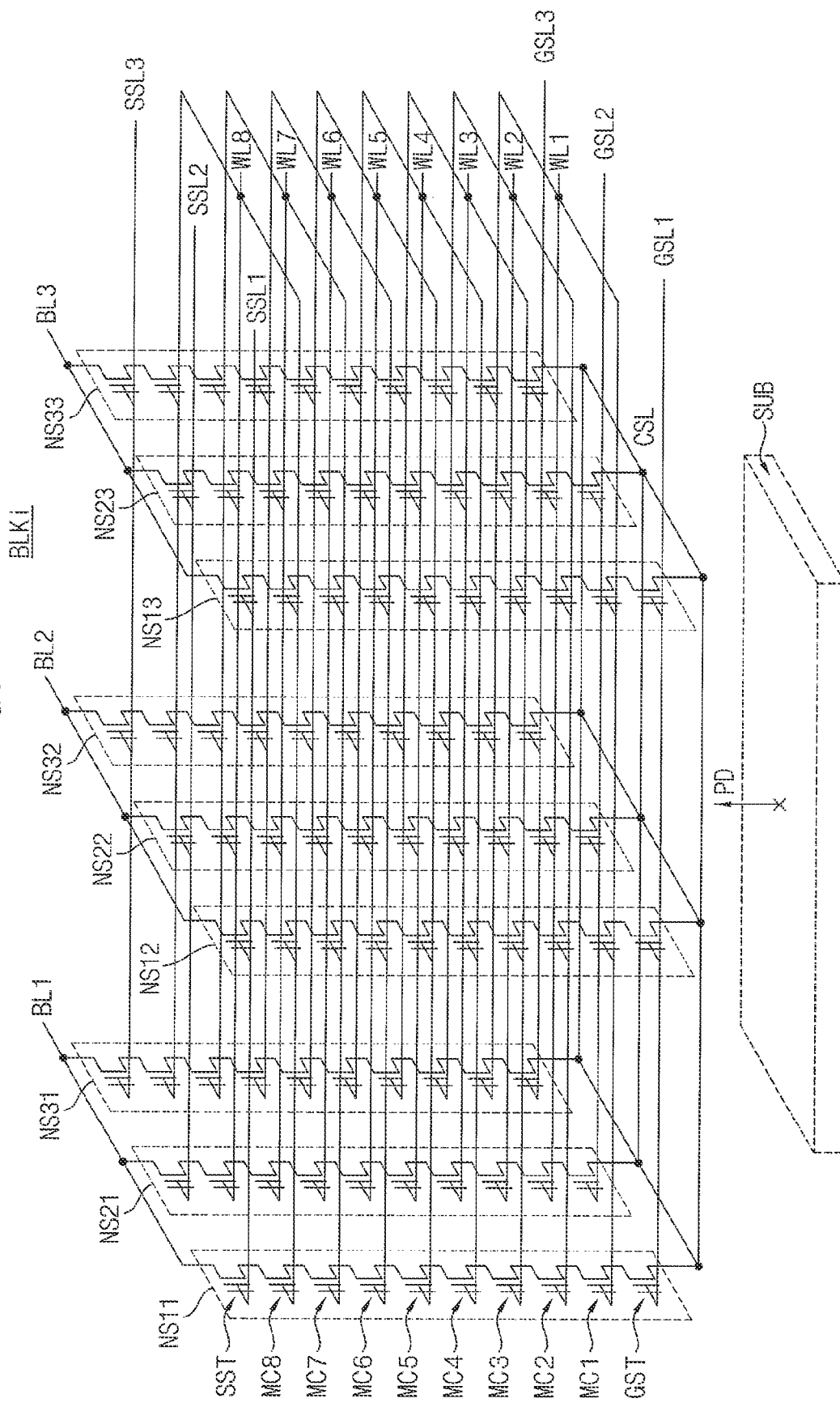
FIG. 7 is a circuit diagram illustrating one of the memory blocks in FIG. 6.

FIG. 7 is a circuit diagram illustrating one of the memory blocks in FIG. 6.

The memory block BLKi of FIG. 7 may be formed on a substrate in a three-dimensional structure (or a vertical structure). For example, a plurality of memory cell strings included in the memory block BLKi may be formed in a direction PD perpendicular to the substrate.

Referring to FIG. 7, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 7, each of the memory cell strings NS11 to NS33 is illustrated as including eight memory cells MC1 to MC8. However, example embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 7, a memory block BLKi is illustrated as being coupled to eight word-lines WL1 to WL8 and three bit-lines BL1 to BL3. However, example embodiments are not limited thereto. In some example embodiments, the memory cell array 300 may be coupled to any number of word-lines and bit-lines.

Figure 8:
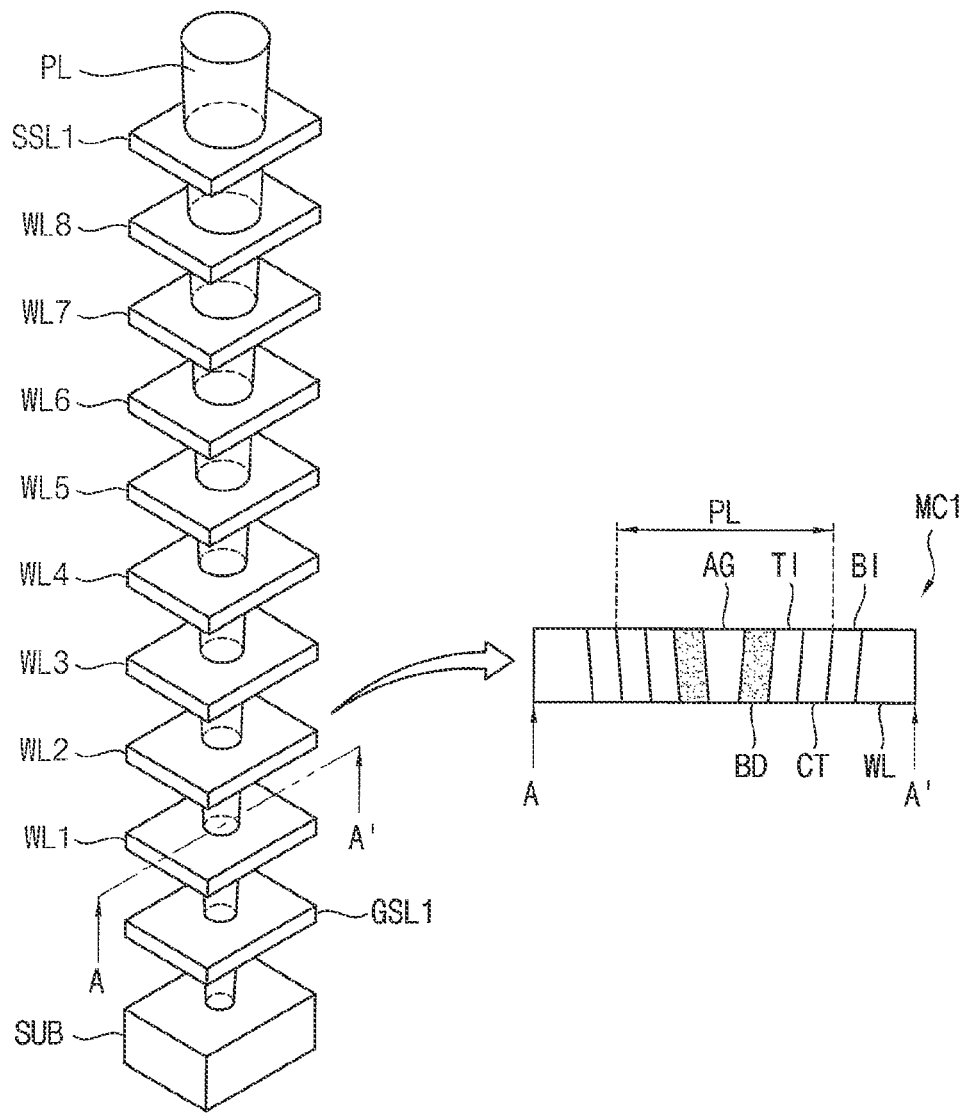
FIG. 8 illustrates an example of a structure of a cell string in the memory block of FIG. 7.

FIG. 8 illustrates an example of a structure of a cell string in the memory block of FIG. 7.

Referring to FIGS. 7 and 8 a pillar PL is provided on the substrate SUB in the cell string NS11 such that the pillar PL extends in a direction perpendicular to the substrate SUB to make contact with the substrate SUB. Each of the ground selection line GSL1, the word lines WL1 to WL8, and the string selection lines SSL illustrated in FIG. 8 may be formed of a conductive material parallel with the substrate SUB, for example, a metallic material. The pillar PL may be in contact with the substrate SUB through the conductive materials forming the string selection lines SSL, the word lines WL1 to WL8, and the ground selection line GSL.

A sectional view taken along a line A-A' is also illustrated in FIG. 8. In an embodiment, a sectional view of a first memory cell MC1 corresponding to a first word line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL may constitute a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Referring back to FIG. 5, the control circuit 500 may receive a command (signal) CMD and an address (signal) ADDR from the memory controller 100 and may control an erase loop, a program loop and a read operation of the nonvolatile memory device 200 based on the command signal CMD and the address signal ADDR. The program loop may include a program operation and a program verification operation. The erase loop may include an erase operation and an erase verification operation.

For example, the control circuit 500 may generate control signals CTLs, which are used for controlling the voltage generator 700 and a control signal PCTL for controlling the page buffer circuit 410, based on the command signal CMD, and generate a row address R_ADDR and a column address C_ADDR based on the address signal ADDR. The control circuit 500 may provide the row address R_ADDR to the address decoder 430 and provide the column address C_ADDR to the data input/output circuit 420.

The address decoder 430 may be coupled to the memory cell array 300 through the string selection line SSL, the plurality of word-lines WLs, and the ground selection line GSL. During the program operation or the read operation, the address decoder 430 may determine one of the plurality of word-lines WLs as a selected word-line and determine the rest of the plurality of word-lines WLs except for the selected word-line as unselected word-lines based on the row address R_ADDR.

The voltage generator 700 may generate word-line voltages VWLs, which are used for the operation of the nonvolatile memory device 200, based on the control signals CTLs from the control circuit 500. The voltage generator 700 may receive power PWR from the memory controller 100. The word-line voltages VWLs may be applied to the plurality of word-lines WLs through the address decoder 430.

For example, during the erase operation, the voltage generator 700 may apply an erase voltage to a well of the memory block and may apply a ground voltage to entire word-lines of the memory block. During the erase verification operation, the voltage generator 700 may apply an erase verification voltage to the entire word-lines of the memory block or sequentially apply the erase verification voltage to word-lines in a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines.

In addition, during the default read operation, the voltage generator 700 may apply a default read voltage to the selected word-line and may apply a read pass voltage to the unselected word-lines. During the recovery read operation, the voltage generator 700 may apply the optimal read level voltage to the selected word-line.

Although not illustrated, the voltage generator 700 may apply an inhibit voltage to the defective bit-lines such that memory cells coupled to the bit-lines are prevented from being programmed.

The page buffer circuit 410 may be coupled to the memory cell array 300 through the plurality of bit-lines BLs. The page buffer circuit 410 may include a plurality of page buffers. In an example embodiment, one page buffer is connected to one bit-line. In another example embodiment, one page buffer is connected to two or more bit-lines.

The page buffer circuit 410 may temporarily store data to be programmed in a selected page or data read out from the selected page.

The data input/output circuit 420 may be coupled to the page buffer circuit 410 through data lines DLs. During the program operation, the data input/output circuit 420 may receive user data DATA and the parity data PRT from the memory controller 100 and provide the user data DATA and the parity data PRT to the page buffer circuit 410 based on the column address C_ADDR received from the control circuit 500. During the read operation, the data input/output circuit 420 may provide the user data DATA and the parity data PRT, which are stored in the page buffer circuit 410, to the memory controller 100 based on the column address C_ADDR received from the control circuit 500.

Figure 9:
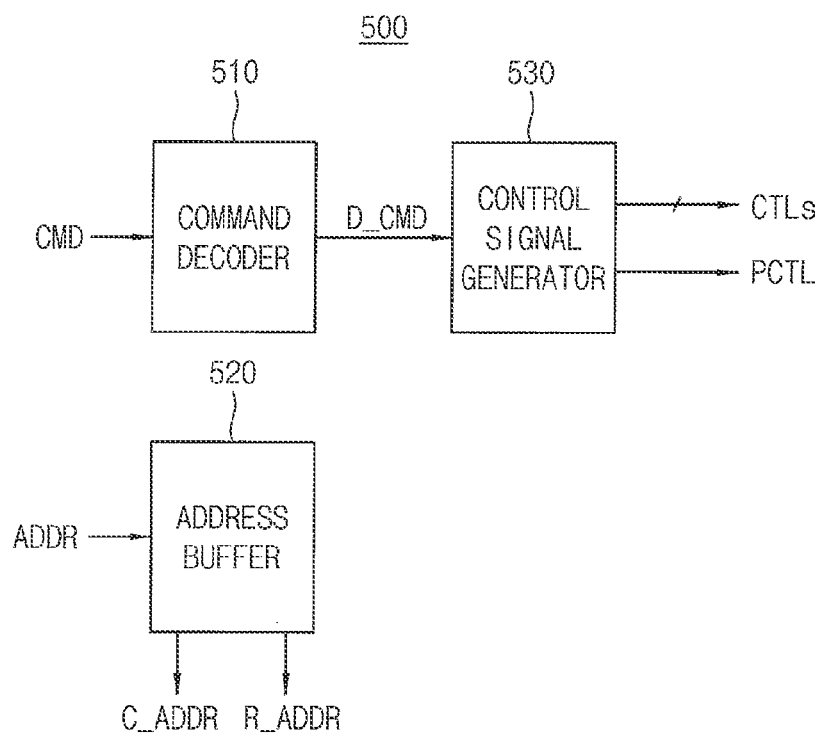
FIG. 9 is a block diagram illustrating a control circuit in the nonvolatile memory device of FIG. 5 according to an example embodiment.

FIG. 9 is a block diagram illustrating the control circuit in the nonvolatile memory device of FIG. 5 according to an example embodiment.

Referring to FIG. 9, the control circuit 500 includes a command decoder 510, an address buffer 520 and a control signal generator 530.

The command decoder 510 may decode the command CMD to generate a decoded command D_CMD and may provide the decoded command D_CMD to the control signal generator 530. The address buffer 520 may receive the address signal ADDR, may provide the row address R_ADDR to the address decoder 430 and may provide the column address C_ADDR to the data input/output circuit 420. The row address R_ADDR and the column address C_ADDR may be determined from the address signal ADDR.

The control signal generator 530 may receive the decoded command D_CMD, may generate the control signals CTLs based on an operation directed by the decoded command D_CMD and may provide the control signals CTLs to the voltage generator 700. In addition, the control signal generator 530 may generate the control signal PCTL based on an operation directed by the decoded command D_CMD, and may provide the control signal PCTL to the page buffer circuit 410.

Figure 10:
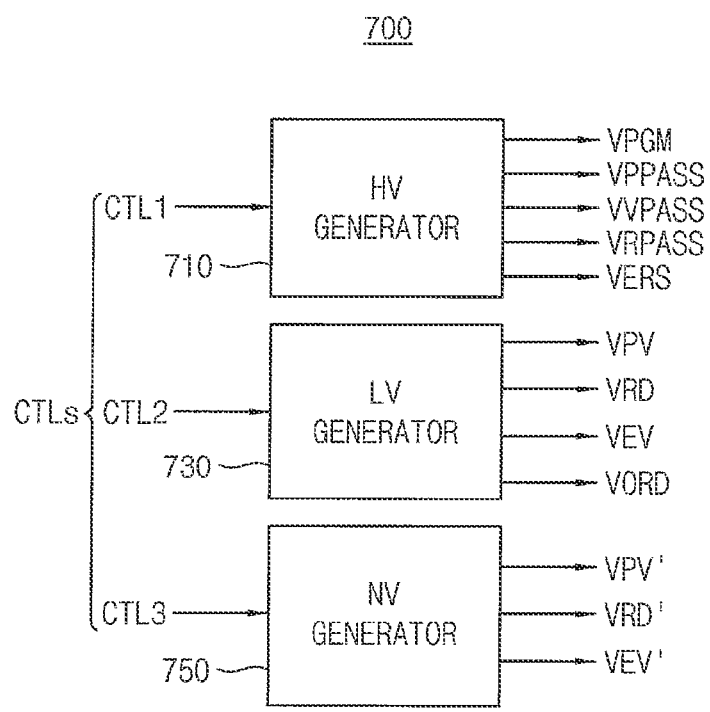
FIG. 10 is a block diagram illustrating a voltage generator in the nonvolatile memory device of FIG. 5 according to an example embodiment.

FIG. 10 is a block diagram illustrating the voltage generator in the nonvolatile memory device of FIG. 5 according to an example embodiment.

Referring to FIG. 10, the voltage generator 700 includes a high voltage generator 710 and a low voltage generator 730. The voltage generator 700 may further include a negative voltage generator 750.

The high voltage generator 710 may generate a program voltage PGM, a program pass voltage VPPASS, a verification pass voltage VVPASS, a read pass voltage VRPASS and an erase voltage VERS according to operations directed by the command CMD, in response to a first control signal CTL1. Although not illustrated, the high voltage generator 710 may generate the inhibit voltage. The program voltage PGM is applied to the selected word-line, the program pass voltage VPPASS, the verification pass voltage VVPASS and the read pass voltage VRPASS may be applied to the unselected word-lines and the erase voltage VERS may be applied to the well of the memory block. The first control signal CTL1 may include a plurality of bits which indicate the operations directed by the command CMD. The program voltage PGM may correspond to a program pulse.

The low voltage generator 730 may generate a program verification voltage VPV, a read voltage VRD, an erase verification voltage VER and an optimal read level voltage VORD according to operations directed by the command CMD, in response to a second control signal CTL2. The program verification voltage VPV, the read voltage VRD, the optimal read level voltage VORD and the erase verification voltage VER may be applied to the selected word-line according to operation of the nonvolatile memory device 200. The second control signal CTL2 may include a plurality of bits which indicate the operations directed by the command CMD.

The negative voltage generator 750 may generate a program verification voltage VPV', a read voltage VRD' and an erase verification voltage VER' which have negative levels according to operations directed by the command CMD, in response to a third control signal CTL3. The third control signal CTL3 may include a plurality of bits which indicate the operations directed by the command CMD.

Figure 11:
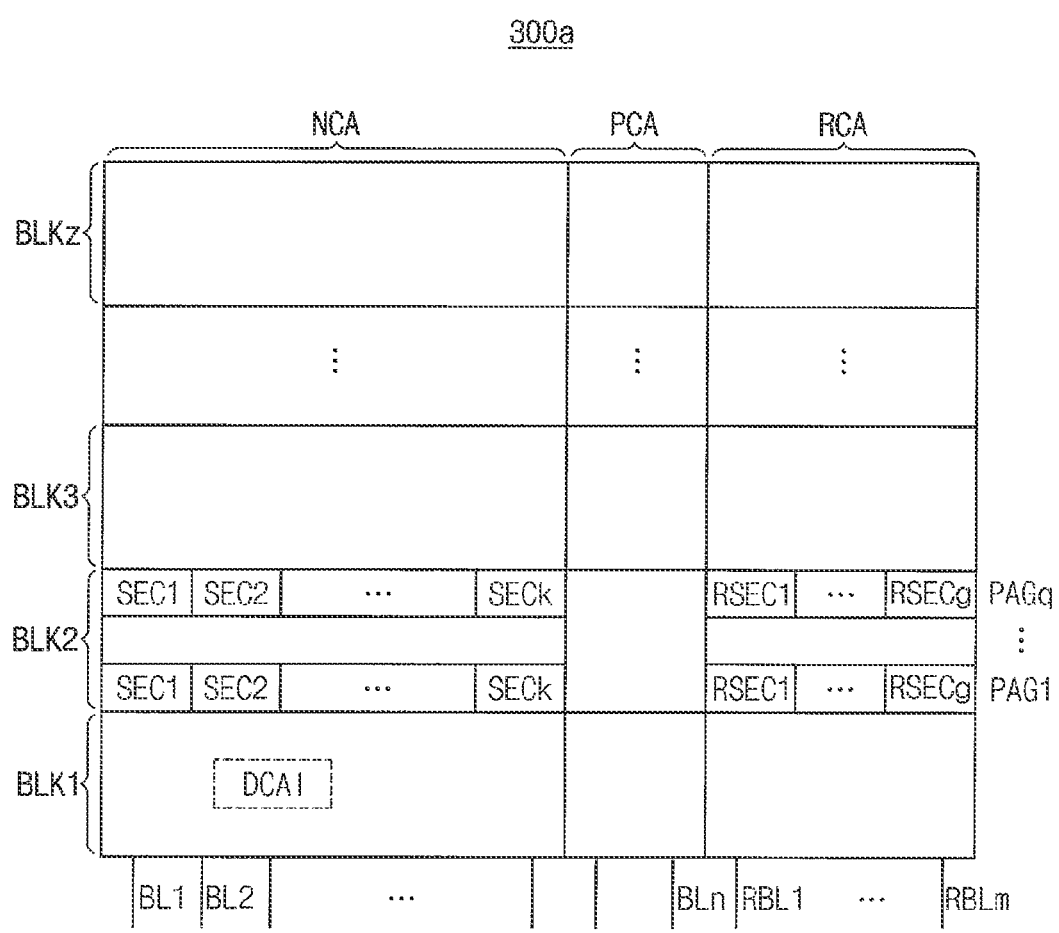
FIG. 11 is a block diagram illustrating an example of the memory cell array in the nonvolatile memory device of FIG. 5 according to an example embodiment.

FIG. 11 is a block diagram illustrating an example of the memory cell array in the nonvolatile memory device of FIG. 5 according to an example embodiment.

Referring to FIG. 11, a memory cell array 300a includes a plurality of memory blocks BLK1~BLKz. Each of the plurality of memory blocks BLK1~BLKz may include a plurality of pages PAG1~PAGq (q is an integer equal to or greater than 2).

The memory cell array 300a may include a normal cell region NCA to store the user data DATA, a parity cell region PCA to store the first parity data PRT1 and a redundancy cell region RCA for repairing defective columns of the normal cell region NCA and the parity cell region PCA. In an example embodiment, a portion of the redundancy cell region RCA is used for repairing defective columns and another portion of the redundancy cell region RCA is used for storing the second parity data PRT2 of the parity data PRT. In an example embodiment, the redundancy cell region RCA is used for storing the second parity data PRT2

Memory cells of the normal cell region NCA and the parity cell region PCA may be coupled to first bit-lines BL1~BLn and memory cells of the redundancy cell region RCA may be coupled to second bit-lines RBL1~RBLm. In an embodiment, n is an integer equal to or greater than 4 and m is an integer equal to or greater than 2 and smaller than n.

Each of the pages in the normal cell region NCA and the parity cell region PCA may include a plurality of sectors SEC1 through SECk and each of the pages of the redundancy cell region RCA may include plurality of redundancy sectors RSEC1 through RSECg. In an embodiment, k is an integer equal to or greater than 3 and g is an integer equal to or greater than 2. When at least one sector (for example, the sector SEC2) among the plurality of sectors SEC1 through SECk includes a defective column, the control circuit 500 may perform the column repair by replacing the sector SEC2 with the redundancy sector RSEC1. The nonvolatile memory device 200 may perform the column repair by sector basis.

The memory controller 100 may control the nonvolatile memory device 200 to perform the column repair on first defective bit-lines having defects in the normal cell region NCA and the parity cell region PCA among the first bit-lines BL1~BLn, may assign additional column addresses to the first defective bit-lines and the second bit-lines RBL1~RBLm, may store the second parity data PRT2 in a region corresponding to the additionally assigned column addresses and the ECC engine 120 may perform the ECC decoding by further using the second parity data PRT2. In an embodiment, the nonvolatile memory device 200 does not perform or skips the column repair on the second bit-lines RBL1~RBLm in the redundancy cell region RCA. The defective bit-lines coupled to defective columns may include the first defective bit-lines on which the column repair is performed and second defective bit-lines on which the column repair is not performed or the column repair is skipped.

The memory block BLK1 may correspond to the information block and may store the defective column address information DCAI.

Figure 12A:
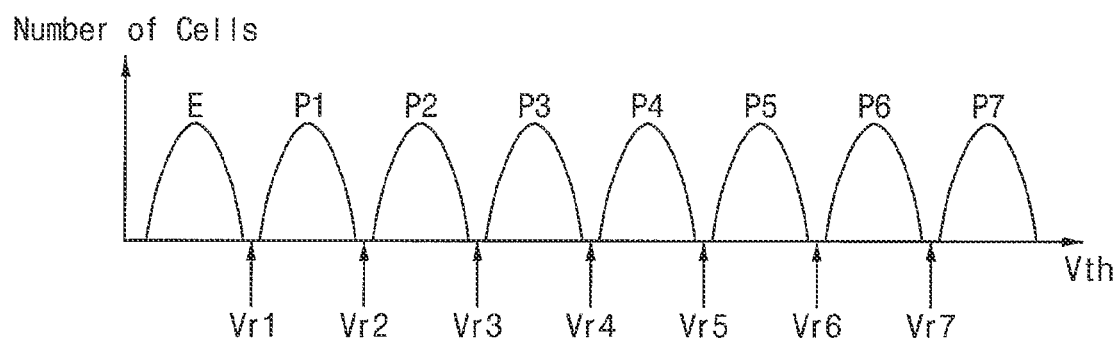
FIG. 12A is a graph showing a threshold voltage distribution of memory cells when a memory cell included in the memory cell array in FIG. 12A is a 3-bit triple level cell.

FIG. 12A is a graph showing a threshold voltage distribution of memory cells when a memory cell included in the memory cell array in FIG. 12 is a 3-bit triple level cell.

Referring to FIG. 12A, a horizontal axis represents a threshold voltage Vth and the vertical axis represents the number of memory cells. When each of the memory cells is a 3-bit triple level cell programmed to store 3 bits, the memory cell may have one from among an erase state E and first through seventh program states P1 through P7. When a memory cell is a multi-level cell, unlike a single-level cell, since an interval between threshold voltages distributions is small, a small change in the threshold voltage Vth may cause a big problem.

A first read voltage Vr1 has a voltage level between a distribution of a memory cell having the erase state E and a distribution of a memory cell having the first program state P1. Each of second through seventh read voltages Vr2 through Vr7 have a voltage level between distributions of memory cells having adjacent program states.

In an example embodiment, assuming that the first read voltage Vr1 is applied, when a memory cell is turned on, data '1' may be stored, and when the memory cell is turned off, data '0' may be stored. However, the present disclosure is not limited thereto, and other example embodiments, assuming that the first read voltage Vr1 is applied, when a memory cell is turned on, data '0' may be stored, and when the memory cell is turned off, data '1' may be stored. As such, a logic level of data may vary.

Figure 12B:
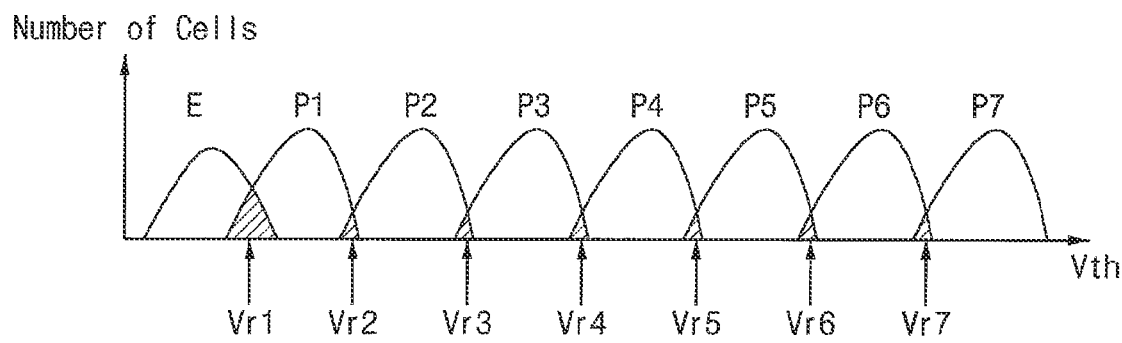
FIG. 12B is a graph showing a case where a threshold voltage of a memory cell in the graph of FIG. 12A is changed.

FIG. 12B is a graph showing a case where a threshold voltage of a memory cell in the graph of FIG. 12A is changed.

Referring to FIG. 12B, memory cells respectively programmed to the erase state E and the first through seventh program states P1 through P7 may have a changed distribution as shown in FIG. 12B according to a read environment. In FIG. 12B, memory cells belonging to hatched portions may have read errors, thereby reducing the reliability of a nonvolatile memory device.

For example, when a read operation is performed on a memory device by using the first read voltage Vr1, although memory cells included in a hatched portion are programmed to the first program state P1, the memory cells may be determined to have the erase state E due to a decrease in the threshold voltage Vth. Accordingly, an error may occur in the read operation, thereby reducing the reliability of the nonvolatile memory device.

When data is read from the nonvolatile memory device 200, a raw bit error rate (RBER) may vary according to a voltage level of a read voltage. An optimum or, alternatively, desirable voltage level of a read voltage maybe determined according to a distribution pattern of the memory cells MCEL. Accordingly, as a distribution of the memory cells changes, an optimum or, alternatively, desirable voltage level of a read voltage needed to read data from the nonvolatile memory device may change. Accordingly, in order to rapidly determine an optimum or, alternatively, desirable level of a read voltage in consideration of a read environment of the nonvolatile memory device to rapidly perform a read operation, a defense code may be selectively executed.

Figure 13:
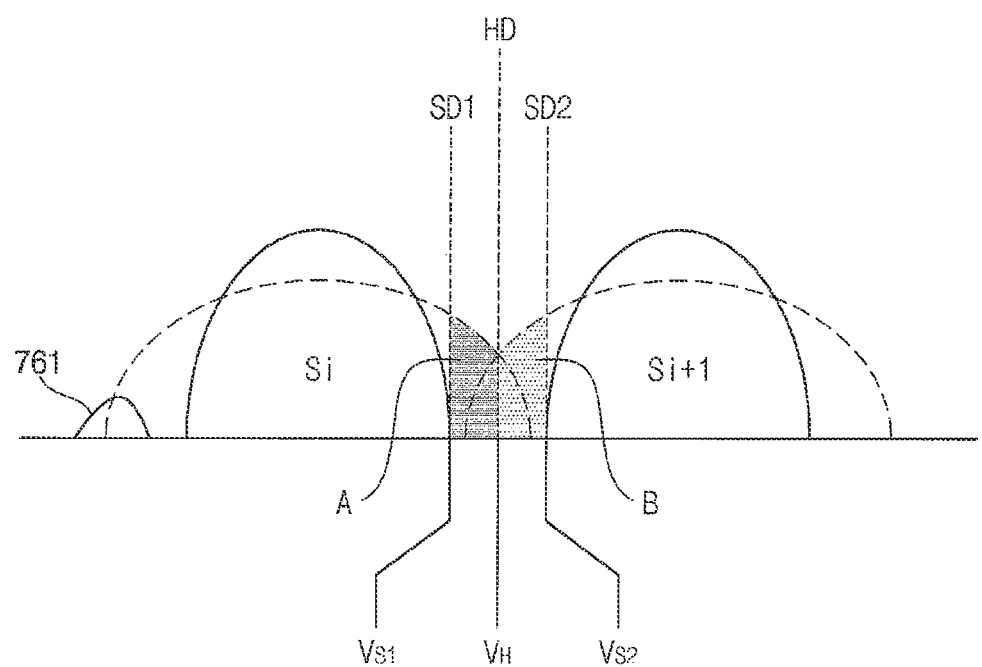
FIG. 13 is a diagram for explaining an operation of determining a level of a read voltage needed for error correction according to an example embodiment.

FIG. 13 is a diagram for explaining an operation of determining a level of a read voltage used for error correction according to an example embodiment.

Referring to FIG. 13, data states of data programmed to a memory cell have to be spaced by a predetermined or, alternatively, desired voltage interval from adjacent data states Si and Si+1 so that a sufficient read margin is secured. When a threshold voltage distribution is formed as marked by a dashed line, a hard decision read voltage $V_H$ for a hard decision decoding HD may be needed and soft decision read voltages $V_{S1}$ and $V_{S2}$ for soft decision decoding operations SD1 and SD2 may be needed. Accordingly, the processor 110 may determine a level of a read voltage for hard decision or soft decision.

The ECC engine 120 may perform an error correction operation by using a read voltage for hard decision or soft decision having the determined level (e.g., the determined read voltage level).

When the ECC engine 120 performs the error correction operation by using a read voltage for soft decision, the ECC engine 120 may enhance error correction capability when defective memory cells, indicated by a reference numeral 761, having 1-error indicating a case where a bit value of 0 is read out wrongly as a bit value of 1, are not detected as errors.

The ECC engine 120 does not determine the memory cells indicated by a reference numeral 761 as defective memory cells based on the defective column address information of the bit-lines coupled to the defective memory cells having the 1-error and may perform the error correction operation by using a read voltage for soft decision.

Figure 14:
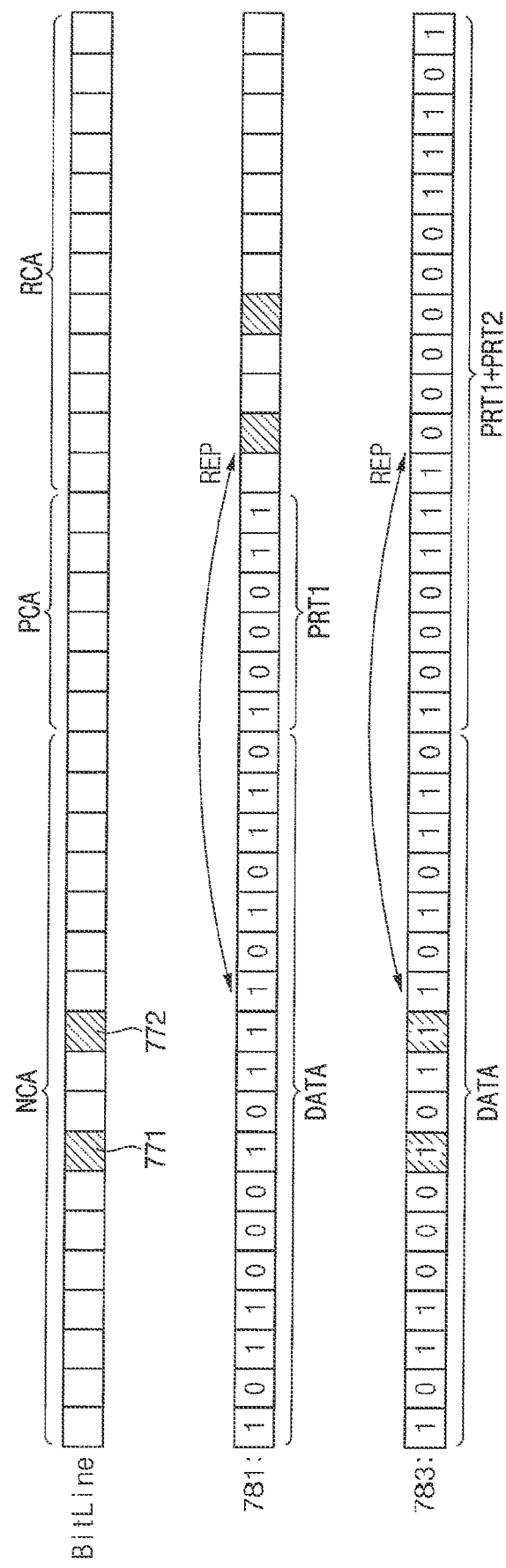
FIG. 14 illustrates an example of an ECC decoding of the storage device according to an example embodiment.

FIG. 14 illustrates an example of an ECC decoding of the storage device according to an example embodiment.

Referring to FIG. 14, memory cells coupled to one word-line, the first bit-lines and the second bit-lines are illustrated. A reference numeral 771 denotes a defective memory cell 771 having 1-error indicating a case where a bit value of 0 is read out wrongly as a bit value of 1. A reference numeral 772 denotes a defective memory cell having 0-error indicating a case where the bit value of 1 is read out wrongly as the bit value of 0.

As indicated by a reference numeral 781, a comparative nonvolatile memory device performs a column repair by replacing REP a sector including the defective memory cells 771 and 772 in the normal cell region NCA with a redundancy sector in the redundancy cell region RCA.

The nonvolatile memory device 200 according to an example embodiment, instead of replacing REP a sector including the defective memory cells 771 and 772 in the normal cell region NCA with a redundancy sector in the redundancy cell region RCA, stores the first parity data PRT1 and the second parity data PRT2 in the parity cell region PCA and the redundancy cell region RCA and the ECC engine 120 in the memory controller 100 performs an ECC decoding on the user data DATA by using the first parity data PRT1, the second parity data PRT2 and the defective column address information of the defective memory cells 771 and 772 to correct errors in the user data DATA as a reference numeral 783 indicates.

Figure 15:
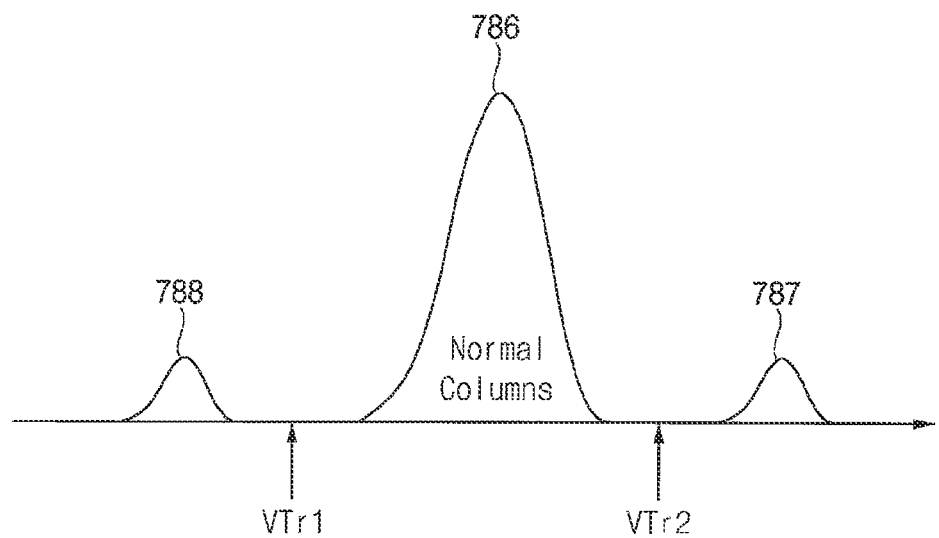
FIGS. 15 and 16 are for explaining an operation to store defective column address information in an information block according to an example embodiment.
Figure 16:
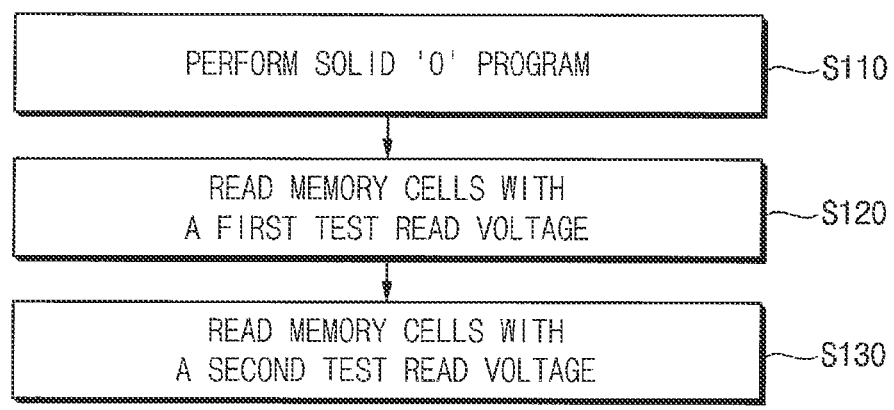

FIGS. 15 and 16 are for explaining an operation to store defective column address information in the information block according to an example embodiment.

In FIG. 15, a reference numeral 786 indicates a threshold voltage distribution of normal memory cells, a reference numeral 787 indicates a threshold voltage distribution of defective memory cells having 0-error and a reference numeral 788 indicates a threshold voltage distribution of defective memory cells having 1-error.

Referring to FIGS. 15 and 16, for detecting the defective memory cells having 0-error and 1-error, the control circuit 500 programs solid data including the bit values of 0 in a first memory block in the normal cell array NCA during a test sequence of the nonvolatile memory device 200 (operation S110). For example, the control circuit 500 may program all 0s in the first memory block.

The control circuit 500 may determine memory cells outputting the bit value of 1 as having the 1-error by applying a first test read voltage VTr1 to a first word-line of the first block (i.e., the information block) (operation S120). In an embodiment, the first test read voltage VTr1 has a voltage level smaller than threshold voltages of programmed memory cells in the first memory block. The control circuit 500 may determine memory cells outputting the bit value of 0 as having the 0-error by applying a second test read voltage VTr2 to the first word-line of the first block (operation S130). In an embodiment, the second test read voltage VTr2 has a voltage level greater than threshold voltages of programmed memory cells in the first memory block.

The control circuit 500 may divide the second defective bit-lines into a first group of defective bit-lines having the 1-error and a second group of defective bit-lines having the 0-error based on an error attribute of the second defective bit-lines during the test sequence and may store column addresses of the first group of defective bit-lines and the second group of defective bit-lines in the first memory block (information block) BLK1 in FIG. 11 as the defective column address information DCAI. The control circuit 500 may store the defective column address information DCAI in the first memory block (information block) BLK1 based on performing a program operation and a read operation on the first memory block in the normal cell region during the test sequence of the nonvolatile memory device 200.

In addition, the control circuit 500 may store patterns in FIG. 15 in the information block, detect the defective memory cells having 1-error by applying the first test read voltage VTr1, detect defective memory cells having 0-error by applying the second test read voltage VTr2, and may provide the defective column address information DCAI based on the output data in response to the first test read voltage VTr1 and the second test read voltage VTr2.

Figure 17:
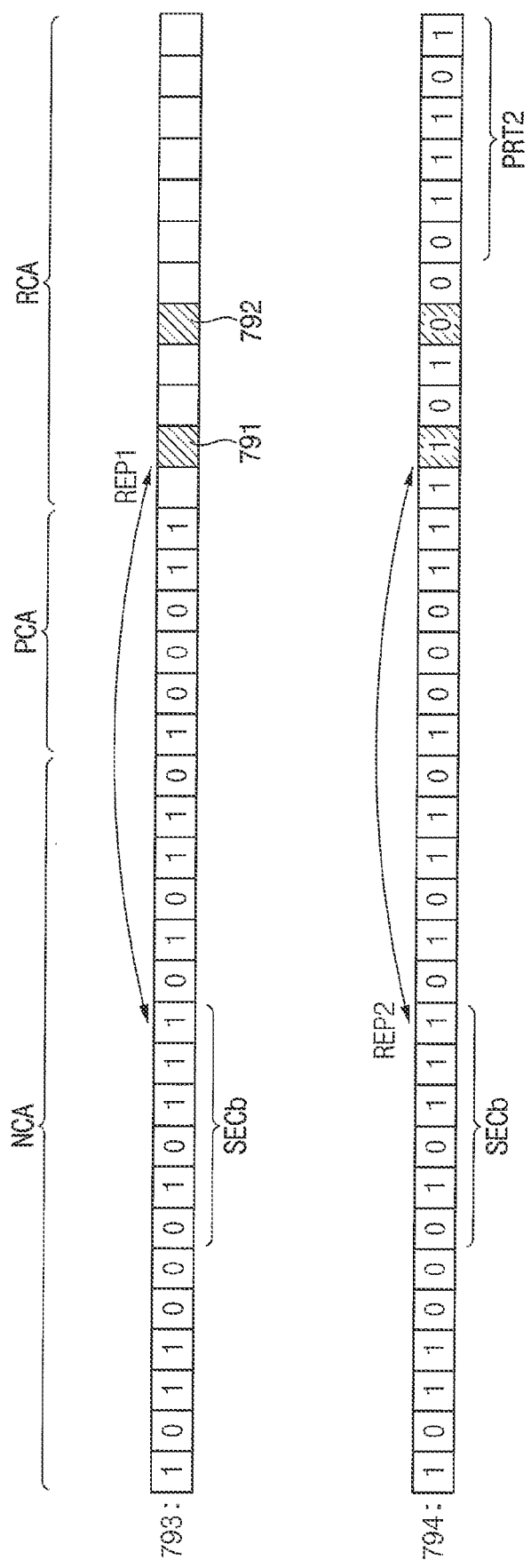
FIG. 17 illustrates an example operation of the storage device of FIG. 2 according to an example embodiment.

FIG. 17 illustrates an example operation of the storage device of FIG. 2 according to an example embodiment.

Referring to FIG. 17, memory cells coupled to one word-line, the first bit-lines and the second bit-lines are illustrated. A reference numeral 791 denotes a defective memory cell 791 having 1-error and a reference numeral 792 denotes a defective memory cell having 0-error.

In FIG. 17, it is assumed that the parity cell region PCA stores the first parity data PRT1.

As a reference numeral 793 indicates, a comparative nonvolatile memory device performs a column repair by replacing (REP1) a sector SECb including the defective memory cells 791 having 1-error and 792 having 0-error in the normal cell region NCA with a redundancy sector in the redundancy cell region RCA.

In the storage device 30 according to an example embodiment, the memory controller 100 uses the redundancy cell region RCA for performing the column repair, assigns additional column addresses to the repaired column and the redundancy cell region RCA and stores the second parity data PRT2 in the repaired column and the redundancy cell region RCA.

The control circuit 500 performs a column repair by replacing (REP2) a sector SECb including the defective memory cells 791 having 1-error and the defective memory cells 792 having 0-error in the normal cell region NCA with a portion of the redundancy cell region RCA. The ECC decoder 122 performs a hard decision decoding on column repair performed user data DATA based on the first parity data PRT1 and performs a soft decision decoding on column repair performed user data DATA based on the first parity data PRT1, the second parity data PRT2 and the defective column address information DCAI as a reference numeral 794 indicates.

Figure 18:
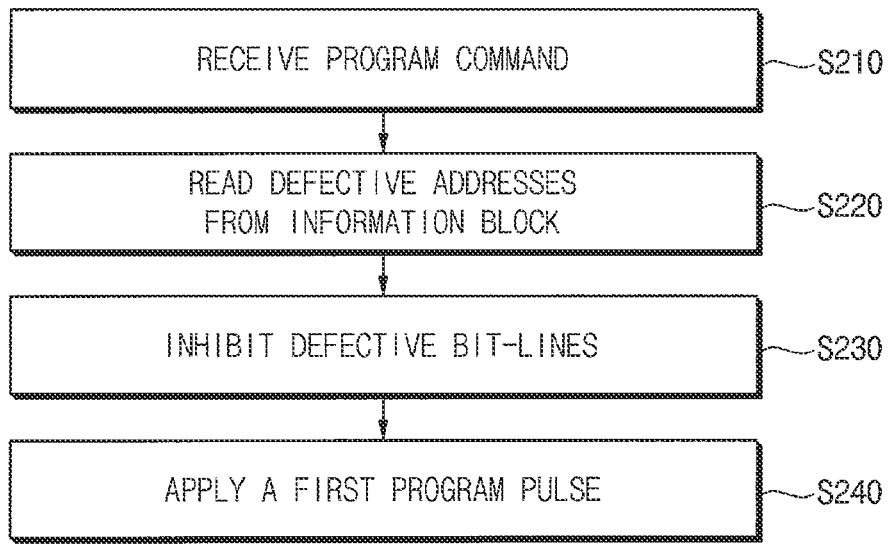
FIGS. 18 through 20 are flow charts illustrating a program operation in response to the memory controller assigning additional column addresses to defective bit-lines, respectively, according to an example embodiment.
Figure 19:
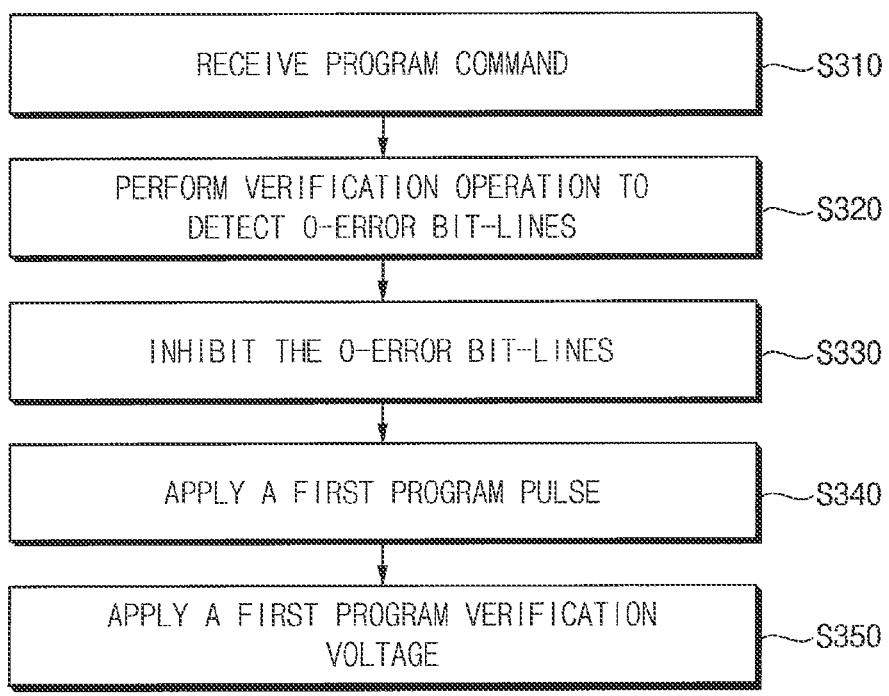
Figure 20:
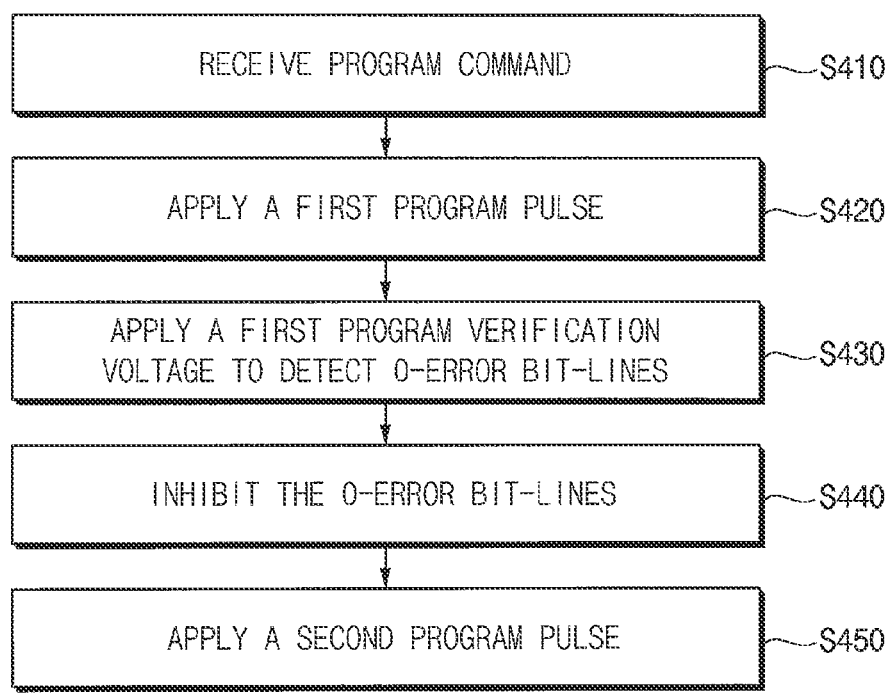

FIGS. 18 through 20 are flow charts illustrating a program operation in response to the memory controller assigning the additional column addresses to the defective bit-lines, respectively, according to example embodiments.

Referring to FIGS. 5 through 11, 15 and 18, in response to the memory controller 100 assigning the additional column addresses to the defective bit-lines, the control circuit 500 receives a program command from the memory controller 100 (operation S210), and the control circuit 500 reads the defective column address information DCAI from the memory block BLK1 storing the information block in response to the program command (operation S220).

The control circuit 500 controls the page buffer circuit 410 to inhibit the second defective bit-lines having the 1-error and the 0-error by applying the inhibit voltage based on the read defective column address information DCAI (operation S230) and controls the address decoder 430 to apply a first program pulse to a target word-line associated with the program command (operation S240). FIG. 18 illustrates that the control circuit 500 inhibits the second defective bit-lines having the 1-error and the 0-error and performs a program operation.

Referring to FIGS. 5 through 11, 15 and 19, in response to the memory controller 100 assigning the additional column addresses to the defective bit-lines, the control circuit 500 receives a program command from the memory controller 100 (operation S310), and the control circuit 500 performs a verification operation to detects the second defective bit-lines having the 0-error (operation S320).

The control circuit 500 controls the page buffer circuit 410 to inhibit the second defective bit-lines having the 0-error based on the verification operation (operation S330), controls the address decoder 430 to apply a first program pulse to a target word-line associated with the program command (operation S340) and controls the address decoder 430 to apply a first program verification voltage to the target word-line (operation S350). FIG. 19 illustrates that the control circuit 500 inhibits the second defective bit-lines having the 0-error and performs a program operation.

Referring to FIGS. 5 through 11, 15 and 20, in response to the memory controller 100 assigning the additional column addresses to the defective bit-lines, the control circuit 500 receives a program command from the memory controller 100 (operation S410), controls the address decoder 430 to apply a first program pulse to a target word-line associated with the program command, and controls the address decoder 430 to apply a first program verification voltage and an error verification pulse to the target word-line to detect a first program state based on the first program pulse and the second defective bit-lines having the 0-error (operation S430).

The control circuit 500 controls the page buffer circuit 410 to inhibit the second defective bit-lines having the 0-error based on the verification operation (operation S440), and controls the address decoder 430 to apply a second program pulse to the target word-line (operation S450). FIG. 20 illustrates that the control circuit 500 inhibits the second defective bit-lines having the 0-error and performs a program operation.

Figure 21:
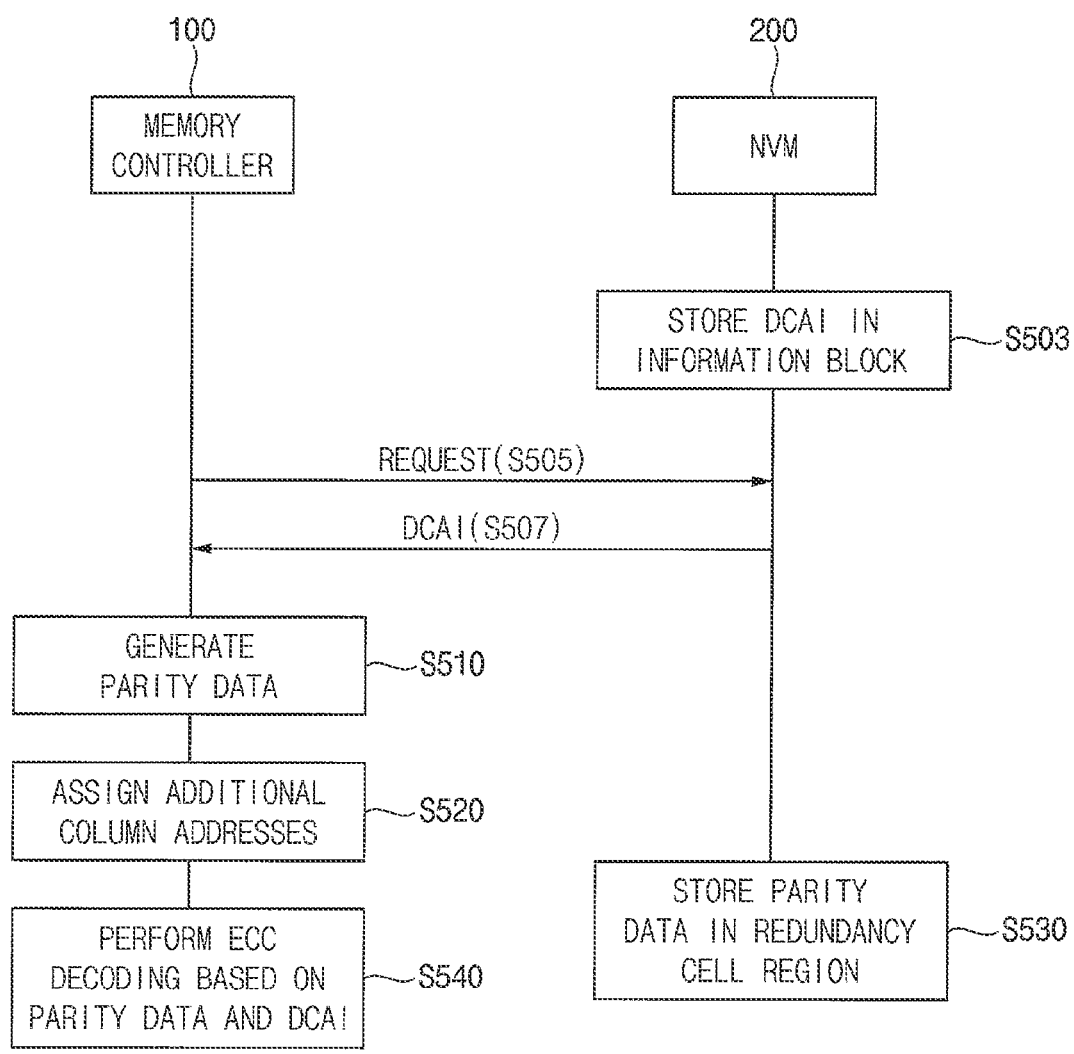
FIGS. 21 and 22 are diagrams for explaining operation of the storage device according to an example embodiment.
Figure 22:
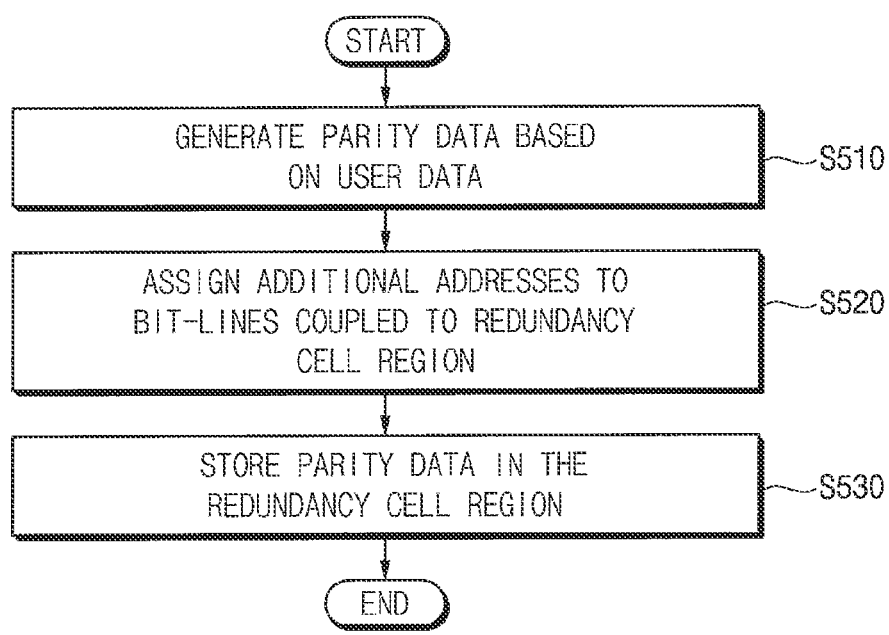

FIGS. 21 and 22 are diagrams for explaining operation of the storage device according to example embodiments.

Referring to FIGS. 2 through 16, 21 and 22, there is provided a method of operating a storage device including a nonvolatile memory device 200 and a memory controller 100 to control the nonvolatile memory device 200.

According to the method, the nonvolatile memory device 200 stores column addresses of defective bit-lines having the 1-error and 0-error in the information block as the defective column address information DCAI during a test sequence of the nonvolatile memory device 200 (operation S503).

The memory controller 100 transmits a request for obtaining the defective column address information DCAI to the nonvolatile memory device 200 (operation S505), and the nonvolatile memory device 200 transfers the defective column address information DCAI to the memory controller 100 in response to the request (operation S507). The memory controller 100 may store the defective column address information DCAI in the buffer 130.

The ECC engine 120 of the memory controller 100 generates parity data PRT by performing an ECC encoding on a user data DATA to be stored in a normal cell region NCA of a memory cell array 300 of the nonvolatile memory device 200 (operation S510). The memory cell array 300 includes the normal cell region NCA, a parity cell region PCA and a redundancy cell region RCA associated with repairing defective columns of the normal cell region NCA and the parity cell region PCA.

The memory controller 100 assigns additional column addresses to first defective bit-lines and second bit-lines (operation S520) and the nonvolatile memory device 200 stores a portion of the parity data PRT in a region corresponding to the additionally assigned column addresses (operation S530). Column repair is performed on first defective bit-lines among first bit-lines connected to the normal cell region NCA and the parity cell region PCA and the second bit-lines are connected to the redundancy cell region RCA.

The ECC engine 120 of the memory controller 100 receives the user data DATA and the parity data PRT from the nonvolatile memory device 200 and performs an ECC decoding on the user data DATA based on the parity data PRT and the defective column address information DCAI.

Figure 23:
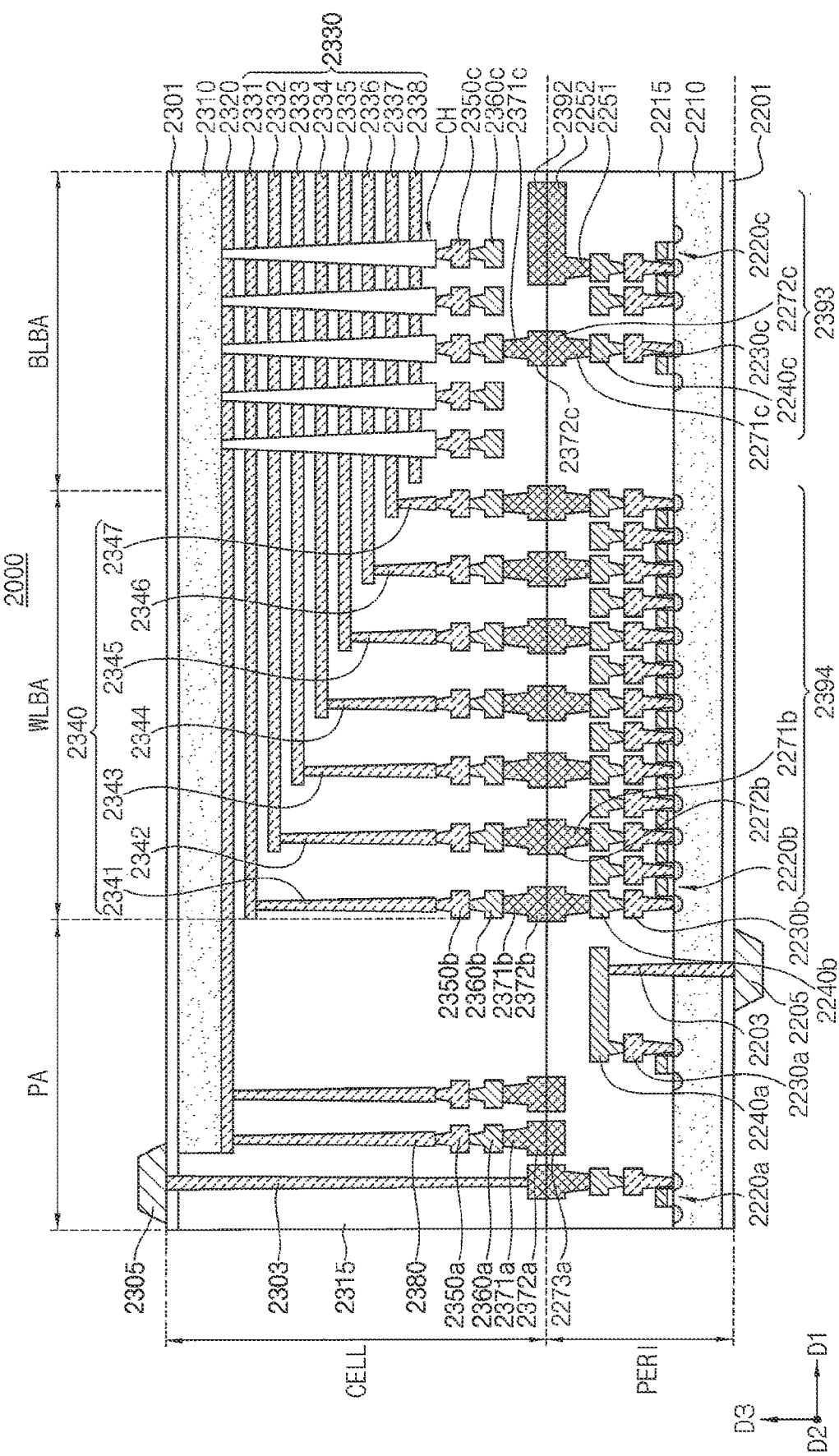
FIG. 23 is a cross-sectional view of a nonvolatile memory device according to an example embodiment.

FIG. 23 is a cross-sectional view of a nonvolatile memory device according to an example embodiment.

Referring to FIG. 23, a nonvolatile memory device or a memory device 2000 may have a chip-to-chip (C2C) structure. The C2C structure may refer to a structure formed by manufacturing/fabricating an upper chip including a memory cell region or a cell region CELL on a first wafer, manufacturing/fabricating a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. In some example embodiments, when the bonding metals may include copper (Cu) using a Cu-to-Cu bonding. The example embodiments, however, are not limited thereto. In some example embodiments, the bonding metals may also be formed of aluminum (Al) and/or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220*a*, 2220*b*, and 2220*c* formed on the first substrate 2210, first metal layers 2230*a*, 2230*b*, and 2230*c* connected to the plurality of circuit elements 2220*a*, 2220*b*, and 2220*c*, and second metal layers 2240*a*, 2240*b*, and 2240*c* formed on the first metal layers 2230*a*, 2230*b*, and 2230*c*, respectively. In some example embodiments, the first metal layers 2230*a*, 2230*b*, and 2230*c* may be formed of tungsten having relatively high electrical resistivity, and the second metal layers 2240*a*, 2240*b*, and 2240*c* may be formed of copper having relatively low electrical resistivity.

In example embodiments illustrated in FIG. 23, although only the first metal layers 2230*a*, 2230*b*, and 2230*c* and the second metal layers 2240*a*, 2240*b*, and 2240*c* are shown and described, the inventive concept is not limited thereto, and one or more additional metal layers may be further formed on the second metal layers 2240*a*, 2240*b*, and 2240*c*. At least a portion of the one or more additional metal layers formed on the second metal layers 2240*a*, 2240*b*, and 2240*c* may be formed of aluminum or the like having a lower electrical resistivity than those of copper forming the second metal layers 2240*a*, 2240*b*, and 2240*c*.

The interlayer insulating layer 2215 may be disposed on the first substrate 2210 and cover the plurality of circuit elements 2220*a*, 2220*b*, and 2220*c*, the first metal layers 2230*a*, 2230*b*, and 2230*c*, and the second metal layers 2240*a*, 2240*b*, and 2240*c*. The interlayer insulating layer 2215 may include an insulating material such as silicon oxide, silicon nitride, or the like.

Lower bonding metals 2271*b* and 2272*b* may be formed on the second metal layer 2240*b* in the word-line bonding area WLBA. In the word-line bonding area WLBA, the lower bonding metals 2271*b* and 2272*b* in the peripheral circuit region PERI may be electrically bonded to upper bonding metals 2371*b* and 2372*b* of the cell region CELL. The lower bonding metals 2271*b* and 2272*b* and the upper bonding metals 2371*b* and 2372*b* may be formed of aluminum, copper, tungsten, and/or the like. Further, the upper bonding metals 2371*b* and 2372*b* in the cell region CELL may be referred as first metal pads and the lower bonding metals 2271*b* and 2272*b* in the peripheral circuit region PERI may be referred as second metal pads.

The cell region CELL may include at least one memory block. The cell region CELL may include a second substrate 2310 and a common source line 2320. On the second substrate 2310, a plurality of word-lines 2331, 2332, 2333, 2334, 2335, 2336, 2337, and 2338 (e.g., 2330) may be stacked in a third direction D3 (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the third direction D3, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350*c* and a second metal layer 2360*c*. In some example embodiments, the first metal layer 2350*c* may be a bit-line contact, and the second metal layer 2360*c* may be a bit-line. In some example embodiments, the bit-line 2360*c* may extend in a second direction D2 (e.g., a Y-axis direction), parallel to the upper surface of the second substrate 2310.

In some example embodiments illustrated in FIG. 23, an area in which the channel structure CH, the bit-line 2360*c*, and the like are disposed may be defined as the bit-line bonding area BLBA. In the bit-line bonding area BLBA, the bit-line 2360*c* may be electrically connected to the circuit elements 2220c providing a page buffer 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346, and 2347 (e.g., 2340). The plurality of word-lines 2330 and the plurality of cell contact plugs 2340 may be connected to each other in pads provided by at least a portion of the plurality of word-lines 2330 extending in different lengths in the first direction D1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming a row decoder 2394 in the peripheral circuit region PERI. In some example embodiments, operating voltages of the circuit elements 2220b forming the row decoder 2394 may be different than operating voltages of the circuit elements 2220c forming the page buffer 2393. In some example embodiments, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, and/or the like, and may be electrically connected to the common source line 2320. A first metal layer 2350a and a second metal layer 2360a may be stacked on an upper portion of the common source line contact plug 2380, sequentially. In some example embodiments, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. Alternatively or additionally, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In some example embodiments, the second input/output pad 2305 is electrically connected to a circuit element 2220a.

According to an embodiment, the second substrate 2310 and the common source line 2320 are not disposed in an area in which the second input/output contact plug 2303 is disposed. Also, in an embodiment, the second input/output pad 2305 does not overlap the word-lines 2330 in the third direction D3. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. In some example embodiments, the memory device 2000 may include only the first input/output pad 2205 disposed on the first substrate 2210 or the second input/output pad 2305 disposed on the second substrate 2310. Alternatively, the nonvolatile memory device 200 may include both the first input/output pad 2205 and the second input/output pad 2305.

A metal pattern provided on an uppermost metal layer may be provided as a dummy pattern (e.g., an electrically inactive pattern) or the uppermost metal layer may be absent, in each of the external pad bonding area PA and the bit-line bonding area BLBA, respectively included in the cell region CELL and the peripheral circuit region PERI.

In the external pad bonding area PA, the nonvolatile memory device 2000 may include a lower metal pattern 2273a, corresponding to an upper metal pattern 2372a formed in an uppermost metal layer of the cell region CELL, and having the same or similar cross-sectional shape as the upper metal pattern 2372a of the cell region CELL so as to be connected to each other, in an uppermost metal layer of the peripheral circuit region PERI. In an embodiment of the peripheral circuit region PERI, the lower metal pattern 2273a formed in the uppermost metal layer of the peripheral circuit region PERI is not connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same or similar cross-sectional shape as the lower metal pattern 2252 of the peripheral circuit region PERI, may be formed in an uppermost metal layer of the cell region CELL. In an embodiment, a contact is not formed on the upper metal pattern 2392 formed in the uppermost metal layer of the cell region CELL.

In some example embodiments, corresponding to a metal pattern formed in an uppermost metal layer in one of the cell region CELL and the peripheral circuit region PERI, a reinforcement metal pattern having the same or similar cross-sectional shape as the metal pattern may be formed in an uppermost metal layer in the other one of the cell region CELL and the peripheral circuit region PERI. In an embodiment, a contact is not formed on the reinforcement metal pattern.

The word-line voltages may be applied to at least one memory block in the cell region CELL through the lower bonding metals 2271*b* and 2272*b* in the peripheral circuit region PERI and upper bonding metals 2371*b* and 2372*b* of the cell region CELL.

Figure 24:
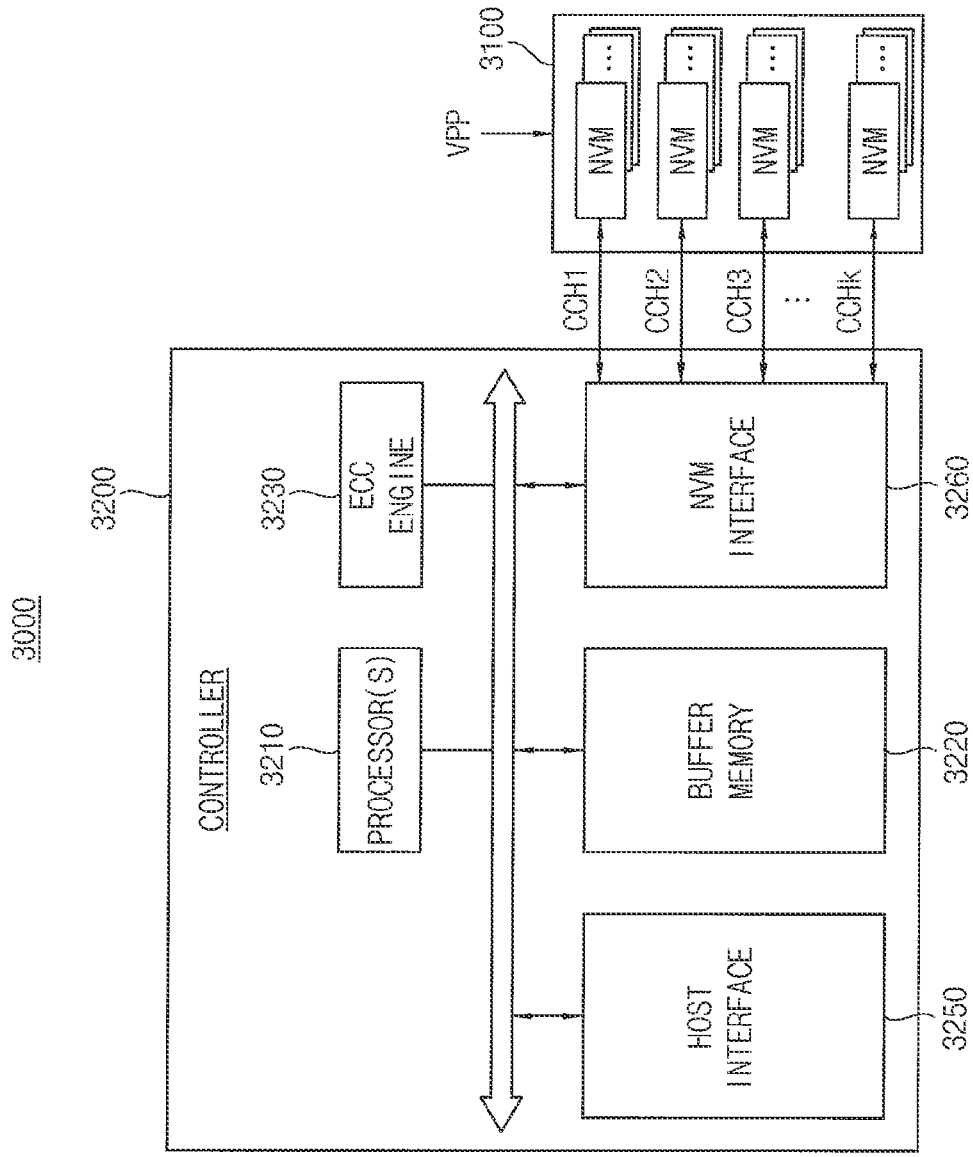
FIG. 24 is a block diagram illustrating a storage device that includes a nonvolatile memory device according to an example embodiment.

FIG. 24 is a block diagram illustrating a storage device that includes a nonvolatile memory device according to an example embodiment.

Referring to FIG. 24, a storage device 3000 includes a plurality of nonvolatile memory devices 3100 and a controller 3200. In some example embodiments, the storage device 3000 may be an embedded multimedia card (eMMC), a universal flash storage (UFS), a solid state disc or a solid state drive (SSD).

The controller 3200 may be connected to the nonvolatile memory devices 3100 via a plurality of channels CCH1, CCH2, CCH3, . . . , CCHk (k being a positive integer). The controller 3200 may include one or more processors 3210, a buffer memory 3220, an error correction code (ECC) engine 3230, a host interface 3250 and a nonvolatile memory (NVM) interface 3260.

The buffer memory 3220 may store data used to drive the controller 3200. The ECC engine 3230 may calculate error correction code values of data to be programmed during a program operation, and may correct an error of read data using an error correction code value during a read operation. In a data recovery operation, the ECC engine 3230 may correct an error of data recovered from the nonvolatile memory devices 3100. The ECC engine 3230 may be implemented by the ECC engine 120 of FIG. 4. Therefore, the ECC engine 2320 may receive parity data including first parity data and second parity data from each of the non-volatile memory devices 3100, may perform a hard decision decoding on the user data based on the first parity data and may perform a hard decision decoding on the user data based on the first parity data, the second parity data and the defective column address information.

The host interface 3250 may provide an interface with an external device. The nonvolatile memory interface 3260 may provide an interface with the nonvolatile memory devices 3100.

Each of the nonvolatile memory devices 3100 may correspond to the nonvolatile memory device described previously according to example embodiments, and may be optionally supplied with an external high voltage VPP.

A nonvolatile memory device or a storage device according to an example embodiment may be packaged using various package types or package configurations.

The present disclosure may be applied to various electronic devices including a nonvolatile memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those of ordinary skill in the art will readily appreciate that many modifications are possible in the example embodiments without materially departing from the present disclosures. Accordingly, all such modifications are intended to be included within the scope of the present disclosures as defined in the claims.

What is claimed is:

1. A nonvolatile memory device including:
 a memory cell array including a normal cell region, a parity cell region and a redundancy cell region associated with repairing defective columns of the normal cell region and the parity cell region, the memory cell array including a plurality of nonvolatile memory cells coupled to first bit-lines and second bit-lines, the first bit-lines connected to the normal cell region and the parity cell region, the second bit-lines connected to the redundancy cell region;
 a page buffer circuit connected to the memory cell array through the first bit-lines and the second bit-lines;
 an address decoder connected to the memory cell array through a plurality of word-lines; and
 a control circuit configured to control the page buffer circuit and the address decoder based on a command and an address received from a memory controller,
 wherein the control circuit is configured to:
 store a user data in the normal cell region,
 perform a column repair on first defective bit-lines among the first bit-lines, each of the first defective bit-lines being associated with a given one of the defective columns, and
 store at least a portion of a parity data in a region corresponding to the first defective bit-lines and the second bit-lines to which additional column addresses are assigned.

2. The nonvolatile memory device of claim 1,
 wherein the control circuit is configured to control the page buffer circuit to perform the column repair on the first defective bit-lines among defective bit-lines, each having the given defective column,
 wherein the control circuit is configured to skip the column repair on at least a portion of second defective bit-lines among the defective bit-lines and is configured to store defective column address information of the portion of second defective bit-lines in an information block, and
 wherein the memory cell array includes a plurality of cell strings vertically stacked on a substrate.

3. The nonvolatile memory device of claim 2, wherein:
 the control circuit is configured to divide the second defective bit-lines into a first group of defective bit-lines and a second group of defective bit-lines based on an error attribute of the second defective bit-lines,
 the first group of defective bit-lines have a 1-error indicating a bit value of 0 is read out wrongly as a bit value of 1, and
 the second group of defective bit-lines have a 0-error indicating the bit value of 1 is read out wrongly as the bit value of 0.

4. The nonvolatile memory device of claim 3, wherein the control circuit is configured to store the defective column address information in the information block based on performing a program operation and a read operation on the information block in the normal cell region during a test sequence on the nonvolatile memory device.

5. The nonvolatile memory device of claim 4, wherein the control circuit is configured to:
program data including bit values of all 0 in the information block;
determine memory cells outputting the bit value of 1 as having the 1-error by applying a first test read voltage to a first word-line of the information block among the word-lines, the first test read voltage having a level smaller than threshold voltages of programmed memory cells in the information block; and
determine memory cells outputting the bit value of 0 as having the 0-error by applying a second test read voltage to the first word-line of the information block, the second test read voltage having a level greater than the threshold voltages of the programmed memory cells in the information block.

6. The nonvolatile memory device of claim 2,
wherein the control circuit is configured to provide the defective column address information to the memory controller in response to a request from the memory controller.

7. The nonvolatile memory device of claim 6, wherein:
the parity data includes a first parity data and a second parity data; and
the control circuit is configured to store the first parity data in the parity cell region and is configured to store the second parity data in the redundancy cell region.

8. The nonvolatile memory device of claim 2, wherein, in response to the additional column addresses being assigned to the defective bit-lines,
the control circuit is configured to:
read the defective column address information from the information block in response to a program command from the memory controller;
control the page buffer circuit to inhibit the second defective bit-lines based on the read defective column address information; and
control the address decoder to apply a first program pulse to a target word-line associated with the program command among the word-lines.

9. The nonvolatile memory device of claim 2, wherein, in response to the additional column addresses being assigned to the defective bit-lines,
the control circuit is configured to control the address decoder in response to a program command from the memory controller such that the address decoder applies a verification voltage to a target word-line associated with the program command among the word-lines, and
wherein the verification voltage is for detecting a first type of defective bit-lines having a 0-error indicating a bit value of 1 is read out wrongly as a bit value of 0.

10. The nonvolatile memory device of claim 9, wherein the control circuit is configured to:
control the page buffer circuit to apply an inhibit voltage to the first type of defective bit-lines; and
control the address decoder to apply a first program pulse to the target word-line and to apply a first program verification voltage to the target word-line.

11. The nonvolatile memory device of claim 2, wherein, in response to the additional column addresses being assigned to the defective bit-lines,
the control circuit is configured to:
control the address decoder to apply a first program pulse to a target word-line associated with the program command among the word-lines; and
control the address decoder to apply a first program verification voltage and an error verification pulse to the target word-line to detect a first program state based on the first program pulse and a first type of defective bit-line having a 0-error indicating a bit value of 1 is read out wrongly as a bit value of 0.

12. The nonvolatile memory device of claim 11, wherein the control circuit is configured to:
control the page buffer circuit to apply an inhibit voltage to the first type of defective bit-line; and
control the address decoder to apply a second program pulse to the target word-line, the second program pulse having a voltage level greater than a voltage level of the first program pulse.

13. The nonvolatile memory device of claim 1, further comprising:
a voltage generator configured to generate word-line voltages based on control signals;
the address decoder coupled to the memory cell array through the word-lines, the address decoder configured to transfer the word-line voltages to the memory cell array based on a row address; and
the page buffer circuit coupled to the memory cell array through the first bit-lines and the second bit-lines, the page buffer circuit configured to store the user data and the parity data in the memory cell array.

14. The nonvolatile memory device of claim 1, further comprising:
a memory cell region including the memory cell array and a first metal pad; and
a peripheral circuit region including a second metal pad, the peripheral circuit region vertically connected to the memory cell region through the first metal pad and the second metal pad,
wherein the peripheral circuit region includes:
a voltage generator configured to generate word-line voltages based on control signals;
the address decoder coupled to the memory cell array through the word-lines, the address decoder configured to transfer the word-line voltages to the memory cell array based on a row address;
the page buffer circuit coupled to the memory cell array through the first bit-lines and the second bit-lines, the page buffer circuit configured to store the user data and the parity data in the memory cell array; and
the control circuit further configured to control the voltage generator.

15. A nonvolatile memory device including:
a memory cell array including a normal cell region, a parity cell region and a redundancy cell region associated with repairing defective columns of the normal cell region and the parity cell region, the memory cell array including a plurality of nonvolatile memory cells coupled to first bit-lines and second bit-lines, the first bit-lines connected to the normal cell region and the parity cell region, the second bit-lines connected to the redundancy cell region;
a page buffer circuit connected to the memory cell array through the first bit-lines and the second bit-lines;
an address decoder connected to the memory cell array through a plurality of word-lines; and
a control circuit configured to control the page buffer circuit and the address decoder based on a command and an address received from a memory controller, wherein the control circuit is configured to:
store user data in the normal cell region, and
store a parity data in a region corresponding to the second bit-lines to which additional column addresses are assigned.

16. The nonvolatile memory device of claim 15,
wherein the control circuit is configured to store defective column address information of defective bit-lines in an information block, each of the defective bit-lines being associated with a given one of the defective columns, and
wherein the memory cell array includes a plurality of cell strings vertically stacked on a substrate.

17. The nonvolatile memory device of claim 16, wherein, in response to the additional column addresses being assigned to the defective bit-lines,
the control circuit is configured to:
read the defective column address information from the information block in response to a program command from the memory controller;
control the page buffer circuit to inhibit the defective bit-lines based on the read defective column address information; and
control the address decoder to apply a first program pulse to a target word-line associated with the program command among the word-lines.

18. A storage device comprising:
a nonvolatile memory device including:
a memory cell array including a normal cell region, a parity cell region and a redundancy cell region associated with repairing defective columns of the normal cell region and the parity cell region, the memory cell array including a plurality of nonvolatile memory cells coupled to first bit-lines and second bit-lines, the first bit-lines connected to the normal cell region and the parity cell region, the second bit-lines connected to the redundancy cell region;
a page buffer circuit connected to the memory cell array through the first bit-lines and the second bit-lines; and
an address decoder connected to the memory cell array through a plurality of word-lines, and
a memory controller configured to control the nonvolatile memory device,
wherein the memory controller includes an error correction code (ECC) engine configured to generate parity data by performing an ECC encoding on user data to be stored in the normal cell region,
wherein the memory controller is configured to:
store the user data in the normal cell region,
assign additional column addresses to the second bit-lines, and
store the parity data in a region corresponding to the second bit-lines.

19. The storage device of claim 18, wherein the nonvolatile memory device further includes:
a control circuit configured to store defective column address information of defective bit-lines in an information block, each of the defective bit-lines being associated with a given one of the defective columns, and
wherein the memory cell array includes a plurality of cell strings vertically stacked on a substrate.

20. The storage device of claim 19, wherein, in response to the memory controller assigning the additional column addresses to the defective bit-lines,
the control circuit is configured to:
read the defective column address information from the information block in response to a program command from the memory controller;
control the page buffer circuit to inhibit the defective bit-lines based on the read defective column address information; and
control the address decoder to apply a first program pulse to a target word-line associated with the program command among the word-lines.

* * * * *